United States Patent
Fujioka et al.

(10) Patent No.: US 12,027,655 B2
(45) Date of Patent: Jul. 2, 2024

(54) LIGHT EMITTING DEVICE AND MANUFACTURING METHOD FOR LIGHT EMITTING DEVICE

(71) Applicant: NICHIA CORPORATION, Anan (JP)

(72) Inventors: Akihiro Fujioka, Tokushima (JP); Yuta Horikawa, Anan (JP)

(73) Assignee: NICHIA CORPORATION, Anan (JP)

(*) Notice: Subject to any disclaimer, the term of this patent is extended or adjusted under 35 U.S.C. 154(b) by 354 days.

(21) Appl. No.: 17/366,974

(22) Filed: Jul. 2, 2021

(65) Prior Publication Data

US 2022/0005992 A1    Jan. 6, 2022

(30) Foreign Application Priority Data

Jul. 6, 2020 (JP) ................. 2020-116546

(51) Int. Cl.
| | |
|---|---|
| *H01L 33/62* | (2010.01) |
| *H01L 33/48* | (2010.01) |
| *H01L 33/50* | (2010.01) |
| *H01L 33/56* | (2010.01) |
| *H01L 33/60* | (2010.01) |

(52) U.S. Cl.
CPC ............ *H01L 33/62* (2013.01); *H01L 33/486* (2013.01); *H01L 33/502* (2013.01); *H01L 33/56* (2013.01); *H01L 33/60* (2013.01); *H01L 2933/0058* (2013.01); *H01L 2933/0066* (2013.01)

(58) Field of Classification Search
None
See application file for complete search history.

(56) References Cited

U.S. PATENT DOCUMENTS

| | | | |
|---|---|---|---|
| 9,893,250 B1* | 2/2018 | Ichikawa | ............... H01L 33/62 |
| 2013/0161670 A1* | 6/2013 | Peng | ................... H01L 33/647 |
| | | | 257/98 |
| 2015/0318458 A1* | 11/2015 | Yamashita | ............. H01L 24/97 |
| | | | 174/251 |
| 2016/0365495 A1* | 12/2016 | Ikenaga | .................. H01L 33/46 |
| 2017/0092816 A1 | 3/2017 | Ikeda et al. | |
| 2017/0213944 A1* | 7/2017 | Naka | ....................... H01L 33/60 |
| 2018/0097150 A1 | 4/2018 | Ikeda et al. | |

(Continued)

FOREIGN PATENT DOCUMENTS

| | | |
|---|---|---|
| JP | 2011-151069 A | 8/2011 |
| JP | 2013-125776 A | 6/2013 |
| JP | 2014-165262 A | 9/2014 |

(Continued)

*Primary Examiner* — Khaja Ahmad
(74) *Attorney, Agent, or Firm* — Foley & Lardner LLP

(57) ABSTRACT

A light emitting device includes: a base including: a first lead including: a first A surface, a first B surface opposite to the first A surface, and a first C surface located between the first A surface and the first B surface and defining at least one first protrusion, a second lead separated from the first lead, and a resin body covering the first C surface and holding the first lead and the second lead; a light emitting element disposed on the first A surface; and a protecting member disposed continuously on at least a portion of the first A surface and in at least a portion of a gap between the first protrusion and the resin body. In a cross-sectional view, the first protrusion extends from a first end portion of the first A surface at a second lead side toward the second lead.

20 Claims, 19 Drawing Sheets

(56) References Cited

U.S. PATENT DOCUMENTS

2019/0027661 A1* 1/2019 Li ........................... H01L 33/62
2020/0176649 A1 6/2020 Tanaka et al.

FOREIGN PATENT DOCUMENTS

| | | | |
|---|---|---|---|
| JP | 2016-136648 | A | 7/2016 |
| JP | 2016-224105 | A | 12/2016 |
| JP | 2017-057339 | A | 3/2017 |
| JP | 2017-069539 | A | 4/2017 |
| JP | 2017-188698 | A | 10/2017 |
| JP | 2020-088302 | A | 6/2020 |

* cited by examiner

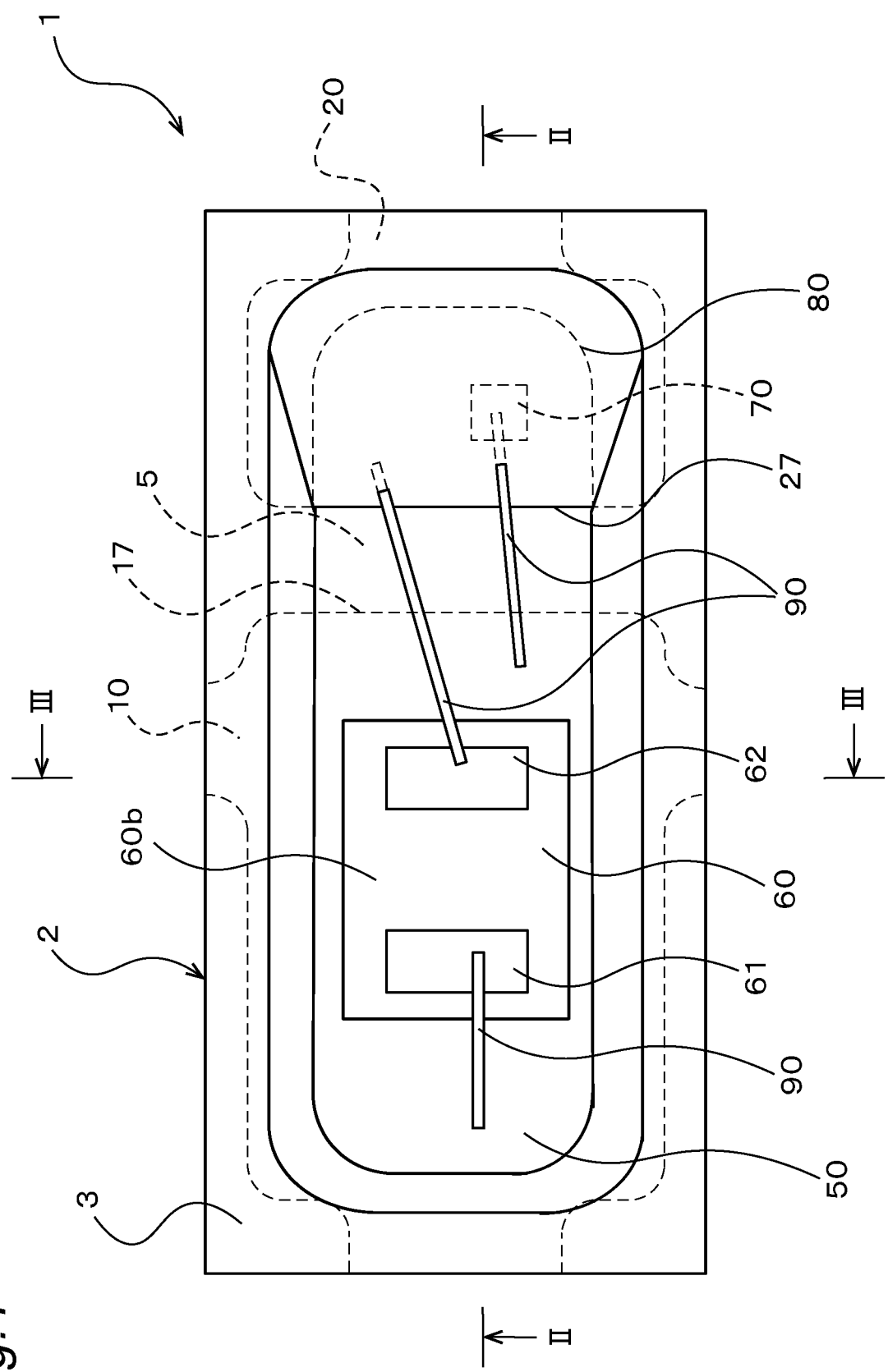

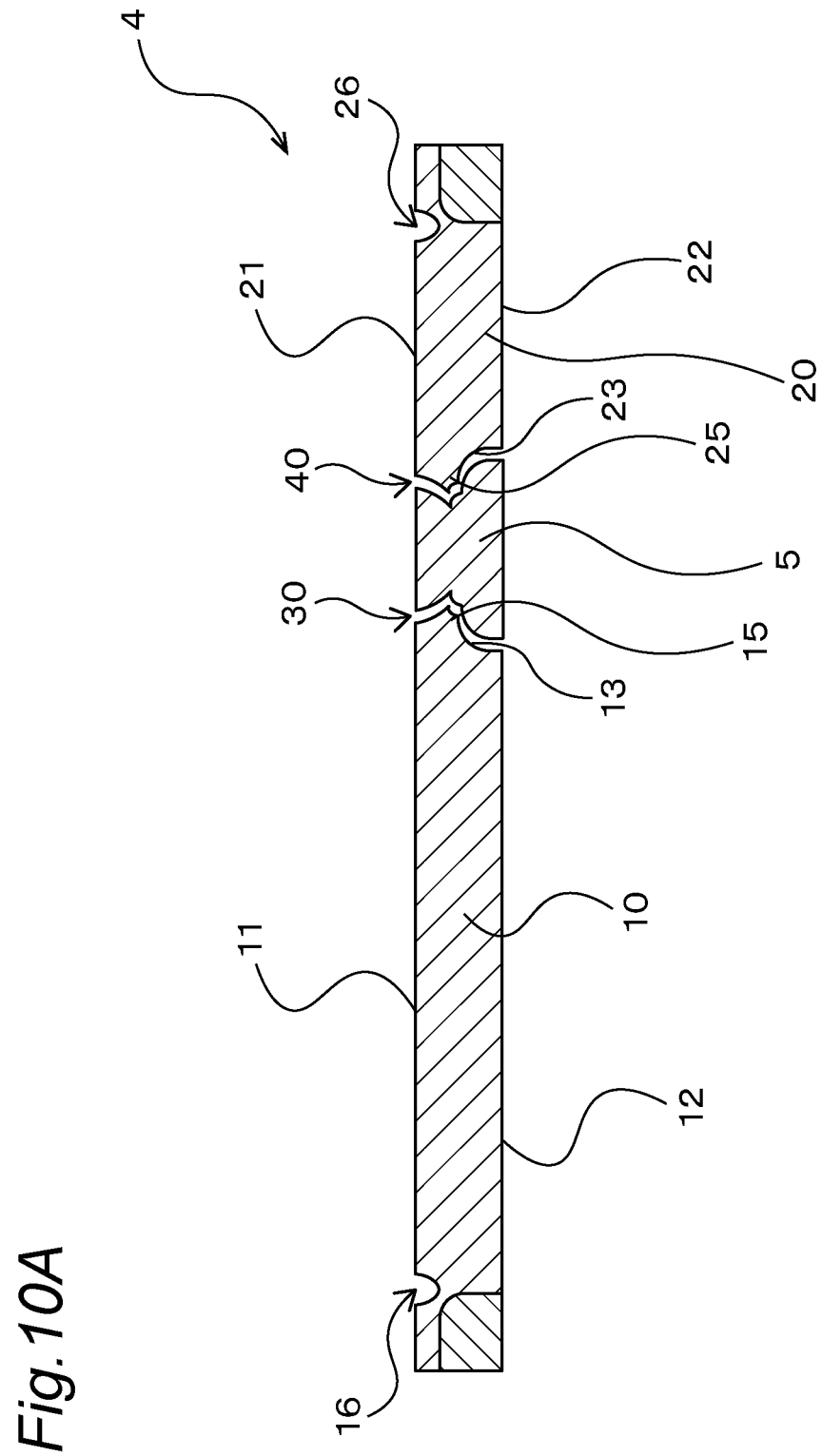

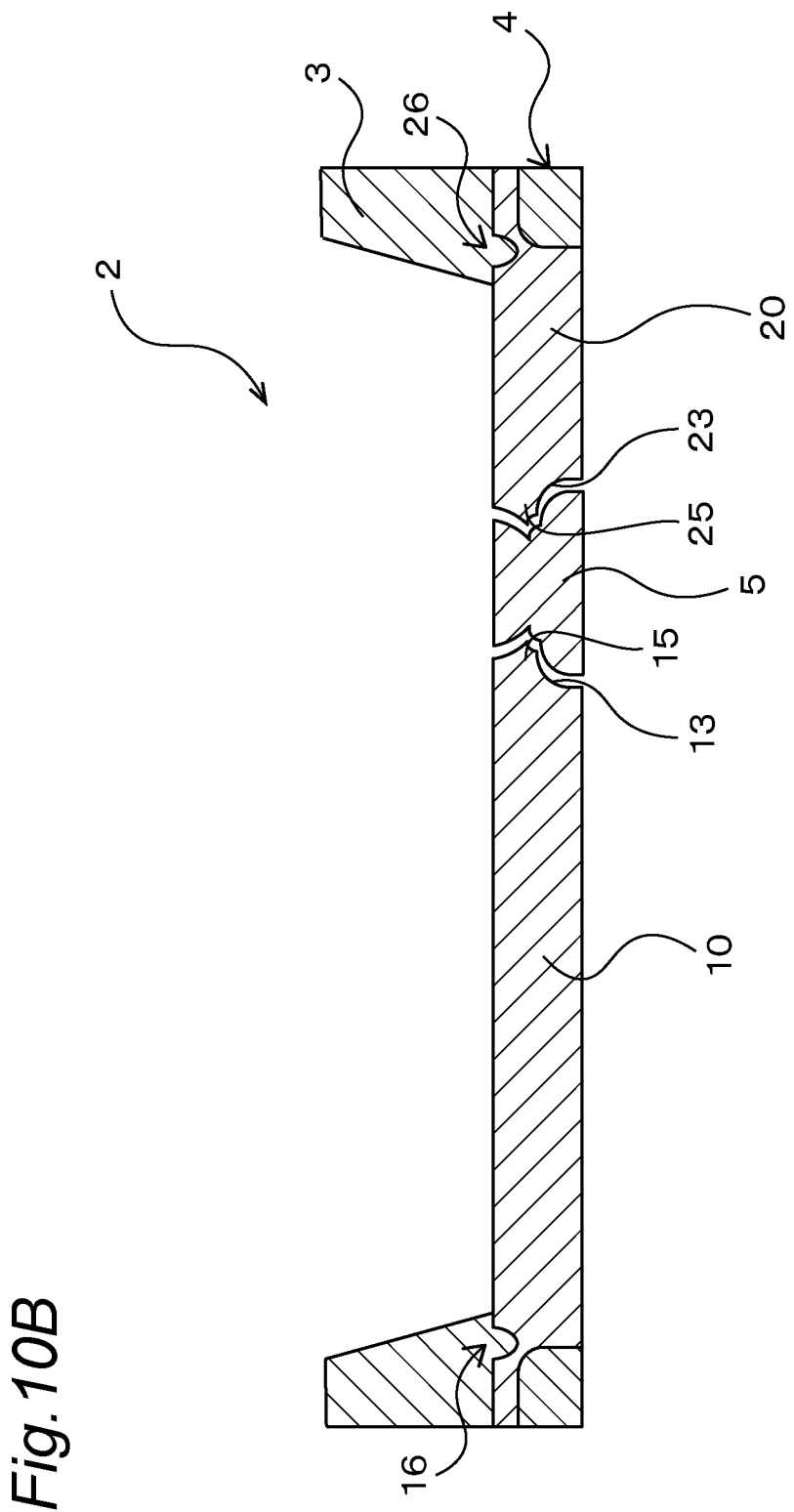

LIGHT EMITTING DEVICE AND MANUFACTURING METHOD FOR LIGHT EMITTING DEVICE

CROSS-REFERENCE TO RELATED APPLICATION

This application claims priority to Japanese Patent Application No. 2020-116546, filed on Jul. 6, 2020, the entire contents of which are hereby incorporated by reference

BACKGROUND

The present disclosure relates to light emitting devices and manufacturing methods for light emitting devices.

Light emitting devices using light emitting elements such as LEDs can easily obtain high light emission efficiency, and thus are used in many devices including backlights for display devices and the like and lighting appliances for illuminating devices. For example, Japanese Patent Application Publication No. 2013-125776 A describes a light emitting device including a substrate having a pair of positive and negative leads and a resin body supporting the pair of leads, and a light emitting element disposed on upper surfaces of the leads. In such light emitting device, there is a demand for further improvement in moisture resistance.

SUMMARY

An object of the present disclosure is to provide a light emitting device having high moisture resistance and a method of manufacturing the light emitting device.

A light emitting device according to an embodiment of the present disclosure includes: a base including a first lead including a first A surface, a first B surface opposite to the first A surface, and first C surfaces located between the first A surface and the first B surface and having at least one first protrusion, a second lead separated from the first lead, and a resin body covering one of the first C surfaces and holding the first lead and the second lead; a light emitting element disposed on the first A surface; and a protecting member disposed continuously on at least a portion of the first A surface and in at least a portion of a gap between the first protrusion and the resin body. The first protrusion extends from a first end portion of the first A surface at a second lead side toward the second lead in a cross-sectional view.

A method of manufacturing a light emitting device according to an embodiment of the present disclosure includes: providing a base including a first lead including a first A surface, a first B surface opposite to the first A surface, and first C surfaces located between the first A surface and the first B surface and having at least one first protrusion, a second lead separated from the first lead, and a resin body covering one of the first C surfaces and holding the first lead and the second lead; disposing a light emitting element on the first A surface; depositing a solution containing resin, particles, and a solvent between the first protrusion and the resin body; and volatilizing the solvent. The first protrusion extends from a first end portion of the first A surface at a second lead side toward the second lead in a cross-sectional view.

According to the light emitting device of the present disclosure, it is possible to provide the light emitting device having high moisture resistance.

In addition, according to the method of manufacturing the light emitting device of the present disclosure, it is possible to manufacture the light emitting device having high moisture resistance.

BRIEF DESCRIPTION OF DRAWINGS

FIG. 1 is a schematic top view of a light emitting device according to a first embodiment.
FIG. 10A is a schematic cross-sectional view illustrating an example of a manufacturing process for the light emitting device according to the first embodiment.
FIG. 10B is a schematic cross-sectional view illustrating an example of a manufacturing process for the light emitting device according to the first embodiment.

DETAILED DESCRIPTION

Figure 2A:
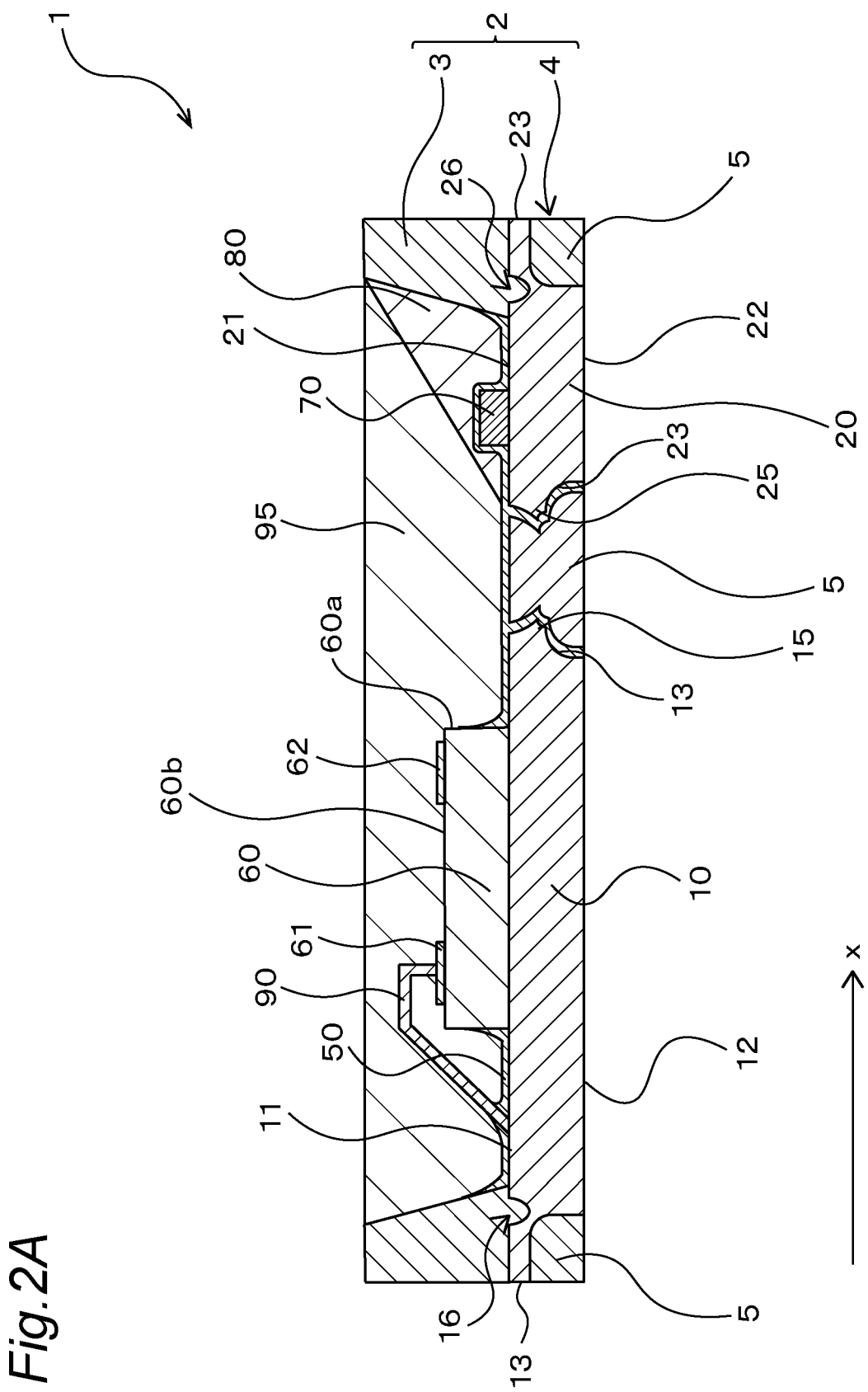
FIG. 2A is a schematic cross-sectional view taken along a line II-II in FIG. 1.

Certain embodiments of the present invention will be described below with reference to the drawings. The embodiments described below exemplify light emitting devices for embodying the technical ideas of the present invention, and the present invention is not limited to the light emitting devices described below.

The present specification is not intended to limit members described in the claims to configurations of the members in the embodiments described below. In particular, dimensions, materials, shapes, relative arrangements, and the like of the constituent components described in the embodiments are not intended to limit the scope of the present invention thereto, unless otherwise specified. In the present specification, a cross-sectional end view, which is a cross-sectional view illustrating only a cut surface, may be used as a cross-sectional view. Sizes, positional relationships, or the like of members illustrated in each of the drawings may be exaggerated for clarity of description. Further, in the following description, members having the same terms and reference characters represent the same members or members made of the same material, and the detailed description thereof will be omitted as appropriate.

First Embodiment

As illustrated in FIGS. 1 and 2A, a light emitting device 1 according to the present embodiment includes a base 2 and a light emitting element 60.

As illustrated in FIG. 2A, the base 2 includes a first lead 10, a second lead 20 separated from the first lead 10, and a resin body 5 holding the first lead 10 and the second lead 20.

Figure 2B:
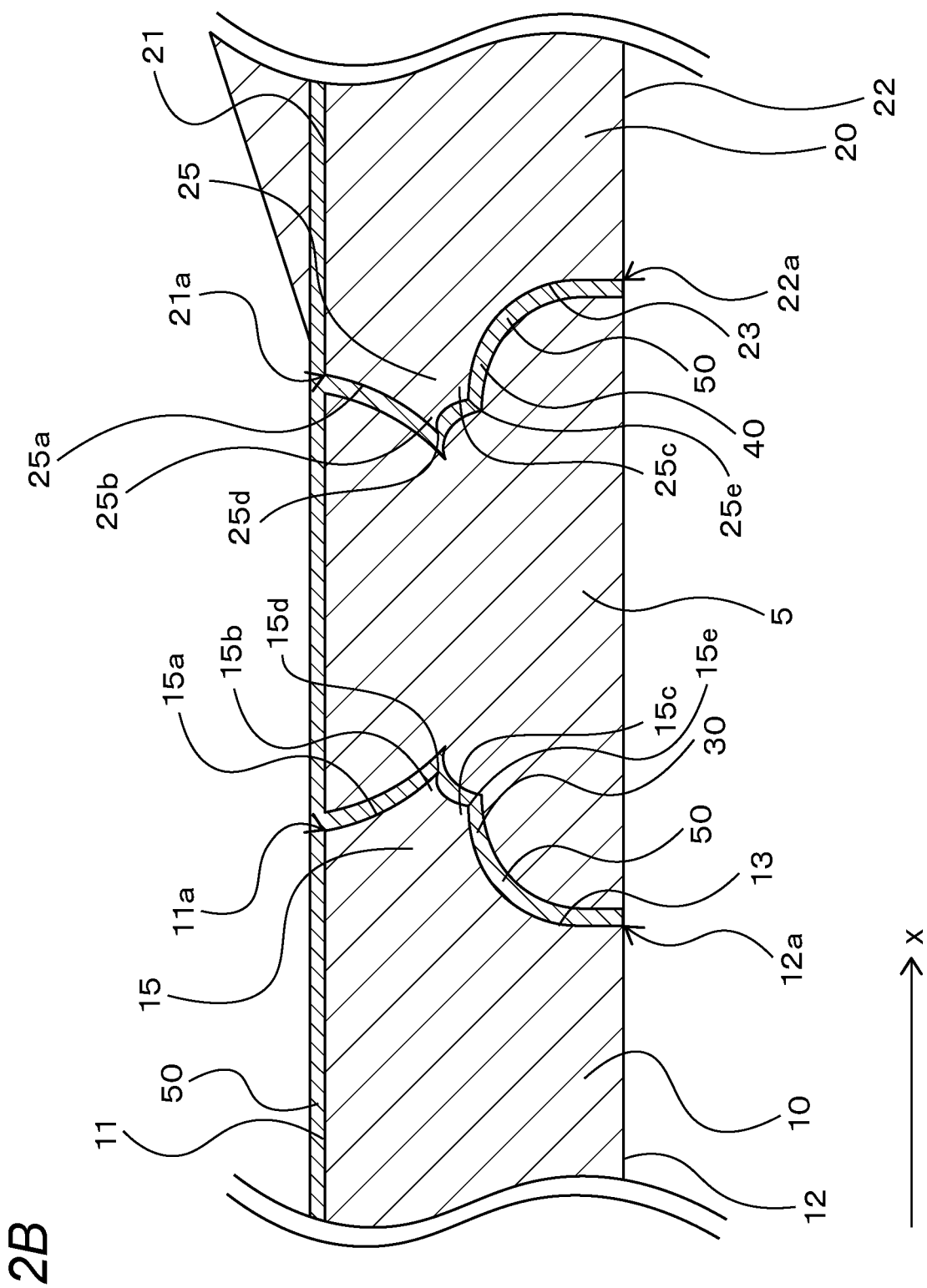
FIG. 2B is a schematic enlarged view of a portion of FIG. 2A.

The first lead 10 includes a first A surface (upper surface) 11, a first B surface (lower surface) 12 opposite to the first A surface 11, and first C surfaces (lateral surfaces) 13 located between the first A surface 11 and the first B surface 12 and including at least one first protrusion 15. As illustrated in FIG. 2B, the first protrusion 15 extends toward the second lead 20 side from a first end portion 11a of the first A surface 11 at the second lead 20 side in a cross-sectional view. The resin body 5 covers corresponding ones of the first C surfaces 13 and holds the first lead 10 and the second lead 20. The light emitting element 60 is disposed on the first A surface 11.

As illustrated in FIG. 2B, the light emitting device 1 further includes a protecting member 50 disposed continuously on at least a portion of the first A surface 11 and in at least a portion of between the first protrusion 15 and the resin body 5. In the present specification, the protecting members 50 disposed continuously at two different positions means that at least a portion of the protecting member 50 disposed at one position is integrated with at least a portion of the protecting member 50 disposed at the other position.

As illustrated in FIG. 2A, the light emitting device 1 according to the present embodiment includes a protecting element 70 disposed on a second A surface (upper surface) 21 of the second lead 20, a reflecting member 80 covering the protecting element 70, and a sealing member 95 covering the light emitting element 60.

For facilitating the understanding of the drawings, the sealing member 95 is omitted in FIGS. 1, 2B, 2C, 2D, 5, and 6.

Components of the light emitting device will be described below in detail.

1. Base

Figure 4:
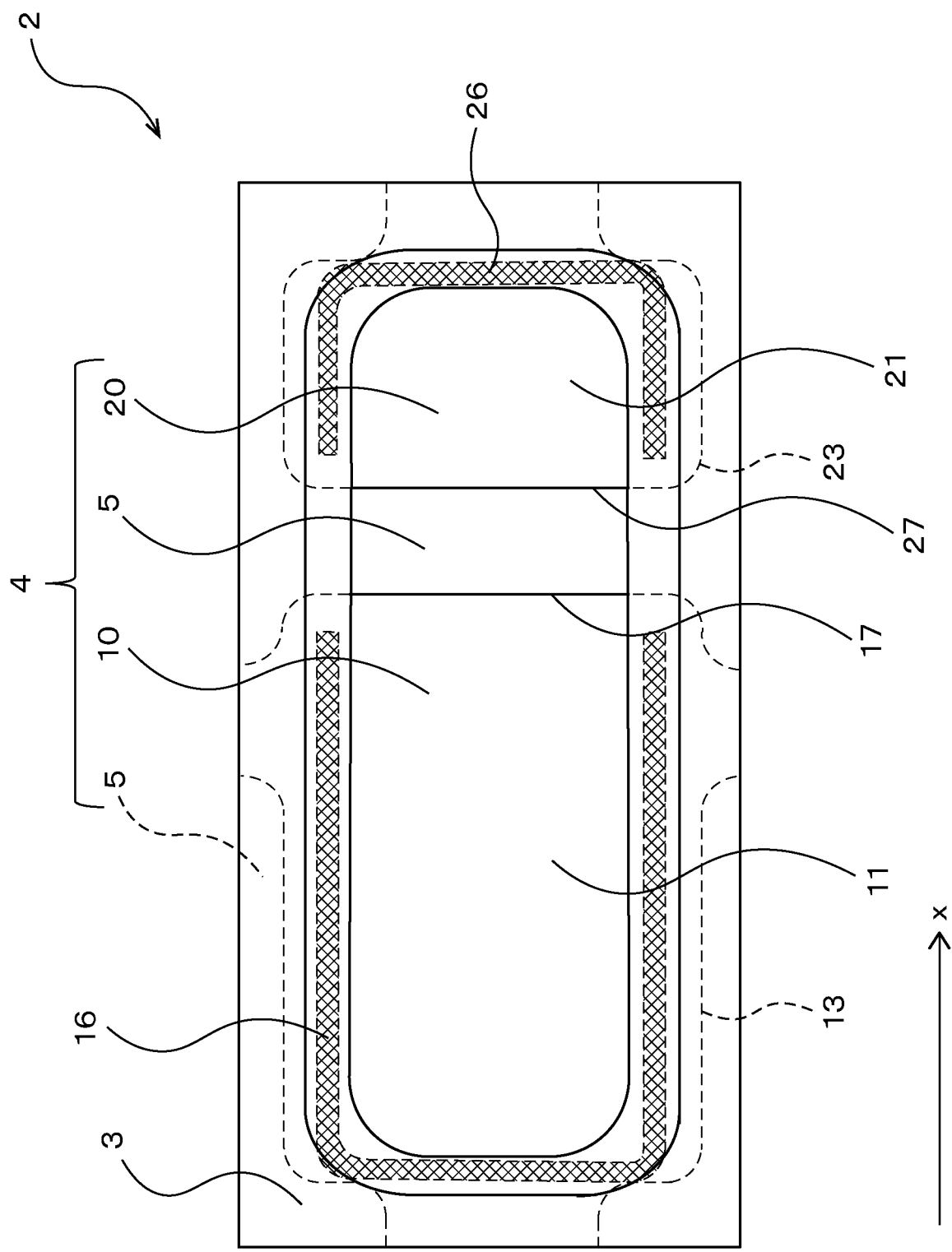
FIG. 4 is a schematic top view of a base according to the light emitting device in FIG. 1.

As illustrated in FIGS. 2A and 4, the base 2 according to the present embodiment includes a bottom portion 4 and a lateral wall portion 3. The bottom portion 4 includes the first lead 10, the second lead 20, and the resin body 5.

The thickness of the first lead 10, that is, the maximum distance between the first A surface 11 and the first B surface 12 is, for example, in a range of 50 μm to 5 mm. The thickness of the second lead 20, that is, the maximum distance between the second A surface 21 and a second B surface 22 is, for example, in a range of 50 μm to 5 mm. The thickness of the first lead 10 and the thickness of the second lead 20 are preferably equal to each other. In the present specification, the expression "equal to each other" allows a variation in value within ±5%.

Figure 3:
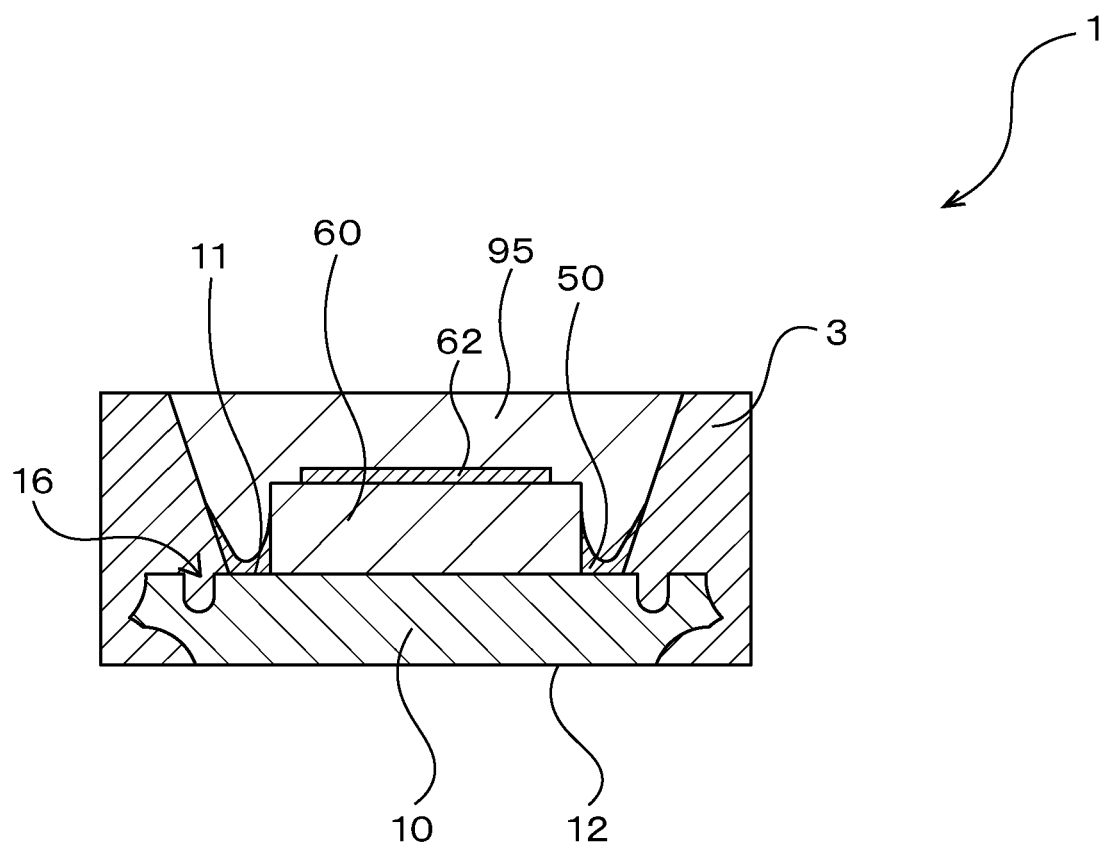
FIG. 3 is a schematic cross-sectional view taken along a line in FIG. 1.

The first lead 10 is a flat plate-shaped conductive member in which the first A surface 11 and the first B surface 12 are substantially parallel to each other. The first lead 10 according to the present embodiment has a substantially rectangular shape having a long side direction and a short side direction in a top view shape. The first lead 10 defines a groove (first groove) 16 on the first A surface 11, as indicated by a shaded portion in FIGS. 2A, 3, and 4. As illustrated in FIG. 4, the first groove 16 is formed along outer edges of the first lead 10 in a top view. In the present embodiment, the first groove 16 has a substantially U shape along three outer edges of the first lead 10 other than an outer edge of the first lead 10 facing the second lead.

The second lead 20 includes the second A surface 21 (upper surface), the second B surface (lower surface) 22 on the opposite side to the second A surface 21, and second C surfaces (lateral surface) 23 located between the second A surface 21 and the second B surface 22 and including at least one second protrusion 25. The second lead 20 is a flat plate-shaped conductive member in which the second A surface 21 and the second B surface 22 are substantially parallel to each other. The second lead 20 according to the present embodiment has a substantially rectangular shape having a long side direction and a short side direction in a top view, and an area of the second lead 20 in a top view is smaller than that of the first lead 10 in the top view. The second lead 20 defines a groove (second groove) 26 on the second A surface 21, as indicated by a shaded portion in FIGS. 2A, 3, and 4. As illustrated in FIG. 4, the second groove 26 is formed along outer edges of the second lead 20. In the present embodiment, the second groove 26 has a substantially U shape along three outer edges of the second lead 20 other than an outer edge of the second lead 20 facing the first lead.

As illustrated in FIGS. 2A and 4, in the bottom portion 4, the first lead 10 and the second lead 20 are separated from each other. The first lead 10 is line-symmetric with respect to a centerline extending in a first direction x, and the second lead 20 is line-symmetric with respect to a centerline extending in the first direction x. The centerline extending in the first direction x of the first lead 10 and the centerline extending in the first direction x of the second lead 20 extend on a single straight line. In the bottom portion 4, the first lead 10 and the second lead 20 are disposed so that the first groove 16 and the second groove 26 are located on the outer periphery of the bottom portion 4. The first lead 10 and the second lead 20 are disposed such that at least one of the first C surfaces 13 and at least one of the second C surfaces 23 face each other.

The first lead 10 and the second lead 20 are held by the resin body 5 disposed in a region between the first lead 10 and the second lead 20. A thermosetting resin, a thermoplastic resin, or the like can be used as a resin material to be the base material for the resin body 5. In the case of using the thermosetting resin, for example, an epoxy resin, modified epoxy resin, silicone resin, modified silicone resin, or the like can be used. In the case of using the thermoplastic resin, for example, a polyphthalamide resin (PPA), polybutylene terephthalate (PBT), unsaturated polyester, or the like can be used. A thermosetting resin having a high heat resistance and light resistance is preferably used as the resin material to be the base material for the resin body 5.

The resin body 5 preferably contains a light reflective material in the resin material to be the base material described above. For the light reflective material, a material that is unlikely to absorb light from the light emitting element and has a refractive index greatly different from that of the resin material to be the base material is preferably used. Examples of the above-discussed light reflective material include titanium oxide, zinc oxide, silicon oxide, zirconium oxide, aluminum oxide, and aluminum nitride.

The resin body 5 may contain a filler having a low light reflectance with respect to external light (sunlight in many cases) of the light emitting device in order to enhance the contrast of the light emitting device. In this case, the color of the resin body 5 is, for example, black or a color approximate to black. For the filler, carbon such as acetylene black, activated carbon or graphite, transition metal oxide such as iron oxide, manganese dioxide, cobalt oxide or molybdenum oxide, colored organic pigment, or the like can be used in accordance with objective usage.

In the present embodiment, the resin body 5 is provided continuously from the region between the first lead 10 and the second lead 20, to a periphery of the first lead 10 as well as the circumference of the second lead 20, which more firmly holds the first lead 10 and the second lead 20. The resin body 5 is disposed covering corresponding ones of the first C surfaces 13 of the first lead 10 and corresponding ones of the second C surfaces 23 of the second lead 20. As illustrated in FIG. 2A, some of the first C surfaces 13 and some of the second C surface 23 are exposed from the resin body 5. Some of the first C surface 13 and some of the second C surface 23 constitute a lateral surface of the bottom portion 4.

The upper surface of the bottom portion 4 includes the first A surface 11 of the first lead 10, the second A surface 21 of the second lead 20, and a surface of the resin body 5. The lower surface of the bottom portion 4 includes the first B surface 12 of the first lead 10, the second B surface 22 of the second lead 20, and a surface of the resin body 5.

Next, the first protrusion 15 and the second protrusion 25 will be described.

As illustrated in FIG. 2A, the first protrusion 15 and the second protrusion 25 are formed in one of the first C surfaces 13 and one of the second C surfaces 23 facing each other in the bottom portion 4. In other words, the first protrusion 15 is formed in a first C surface 13 located at the second lead 20 side, and the second protrusion 25 is formed in a second C surface 23 located at the first lead 10 side. With the first C surface 13 having the first protrusion 15, a length of a path of a gap between the first C surface 13 and the resin body 5 in a cross-sectional view can be increased. This allows for reducing entry of moisture into the light emitting device through the gap. Similarly, with the second C surface 23 having the second protrusion 25, it is possible to reduce entry of moisture into the light emitting device through the gap.

As illustrated in FIG. 2B, the first protrusion 15 extends toward the second lead 20 side from the first end portion 11a of the first A surface 11 at the second lead 20 side. With the first C surface 13 having the first protrusion 15 extending from the first end portion 11a toward the second lead 20 side, a solution, which will be described below, is likely to remain on the first protrusion when the solution is impregnated into the gap between the first C surface 13 and the resin body 5 to form the protecting member 50. This allows for reducing formation of the protecting member 50 on the first B surface 12. Further, in the present embodiment, the first protrusion 15 extends toward the second lead 20 side from a second end portion 12a of the first B surface 12 at the second lead 20 side. As a result, when the solution is impregnated into the gap between the first C surface 13 and the resin body 5 to form the protecting member, the solution is likely to remain on the second protrusion. Furthermore, in the present embodiment, the first end portion 11a is located closer to the second lead 20 than the second end portion 12a. This can facilitate increase of the area of the first A surface in a top view. Accordingly, the area of the light emitting element disposed on the first A surface can also be increased in the top view, which allows for facilitating increase of the output of the light emitting device. The first protrusion 15 in the present embodiment is located closer to the second lead 20 than the second end portion 12a is to the second lead 20. This allows for increasing a distance from the first lead 10 to the second lead 20 on the lower surface of the bottom portion 4 of the base 2. This can facilitate preventing short-circuiting of the light emitting device that may occur when a wiring substrate is electrically connected with the lower surface of the first lead 10 and the lower surface of the second lead 20.

In the present embodiment, a distance in the first direction x between the second end portion 12a and the first end portion 11a of the first lead 10 is, for example, in a range of 10 μm to 1 mm.

As illustrated in FIG. 2B, the first protrusion 15 according to the present embodiment has two tip portions (a first tip portion 15b and a second tip portion 15c).

The tip portion is a region forming a single point, a straight line, or a curved line in a cross-sectional view, and specifically is a region as will be described below.

When the tip portion is a single point in a cross-sectional view, the tip portion can be regarded as, in a cross-sectional view, a single point (inflection point) at which a slope of a contour line of the first protrusion 15 with respect to the first A surface 11 (or the first B surface 12) changes discontinuously. Mathematically speaking, in the cross-sectional view, the derivative of the contour line of the first protrusion 15 changes discontinuously before and after the single point (inflection point).

Also, when the tip portion is a single point in the cross-sectional view, the first protrusion 15 has a corner, and the tip portion can be a vertex of the corner. When the vertex of the corner is cut with a straight line, the tip portion is a straight line (so-called C chamfering). When the vertex of the corner is rounded, the tip portion is a curved line (so-called R chamfering).

The first tip portion 15b is a tip portion located closest, among the tip portions, to the second lead 20. In the present embodiment, the first tip portion 15b is located close to the first A surface 11 than the second tip portion 15c, and the first tip portion 15b is located closer to the first A surface 11 than to the first B surface 12.

In the present embodiment, a distance in the first direction x between the second end portion 12a and a tip end 15d of the first tip portion 15b of the first lead 10 is, for example, in a range of 10 μm to 1 mm. The tip end 15d of the first tip portion 15b refers to a point, within the first tip portion 15b, located closest to the second lead 20 in the cross-sectional view. Further, a distance in the first direction x between the second end portion 12a and a tip end 15e of the second tip portion 15c of the first lead 10 is, for example, in a range of 10 μm to 1 mm. The tip end 15e of the second tip portion 15c refers to a point, within the second tip point 15c, located on a side closest to the second lead 20 in the cross-sectional view. The tip end 15e of the second tip portion 15c is provided at a position apart from the first B surface 12 by a distance in a range of 10 μm to 1 mm, for example, in a thickness direction of the first lead 10, and the tip end 15d of the first tip portion 15b is provided at a position apart from the first B surface 12 by a distance in a range of 10 μm to 1 mm, for example, in the thickness direction of the first lead 10.

In the first protrusion 15, it is preferable that a surface extending from the first end portion 11a to the first tip portion 15b of the first protrusion 15 include a curved surface 15a concavely curved toward the first B surface 12.

As described above, with the first protrusion 15 having the curved surface 15a, when a solution to be described later is impregnated into the gap between the first C surface 13 and the resin body 5 to form the protecting member, the solution is likely to remain on the curved surface 15a. This allows for reducing formation of the protecting member on the first B surface 12.

While the first tip portion 15b is located closer to the first A surface 11 than the second tip portion 15c in the present embodiment, the second tip portion 15c may be located closer to the first A surface 11 than the first tip portion 15b. The number of tip portions included in the first protrusion 15 may be other than two.

In the present embodiment, as illustrated in FIG. 2B, the cross-sectional shape of the first protrusion 15 and the cross-sectional shape of the second protrusion 25 are line-symmetric with respect to a centerline extending in the thickness direction of the first lead 10 and the second lead 20 and centered between the first end portion 11a of the first lead 10 and a first end portion 21a of the second lead 20. In other words, the cross-sectional shape of the second protrusion 25 is a shape obtained by inverting the first protrusion 15 in the right and left direction in FIG. 2B. In the present specification, the expression "line-symmetric" allows a variation in shape within ±3%.

The second protrusion 25 extends toward the first lead 10 side from the first end portion 21a on the first lead 10 side of the second A surface 21. Further, in the present embodiment, the second protrusion 25 extends toward the first lead 10 side from a second end portion 22a on the first lead 10 side of the second B surface 22. Furthermore, in the present embodiment, the first end portion 21a is located closer to the first lead 10 than the second end portion 22a. Thus, the second protrusion 25 in the present embodiment is located closer to the first lead 10 side than the second end portion 22a.

In the present embodiment, a distance in the first direction x between the second end portion 22a and the first end portion 21a of the second lead 20 is, for example, in a range of 10 μm to 1 mm.

The second protrusion 25 according to the present embodiment has two tip portions (a first tip portion 25b and a second tip portion 25c). The tip portion of the second protrusion 25 is a region similar to the tip portion of the first protrusion 15 described above, and the first tip portion 25b of the second protrusion 25 is a tip portion located closest, among the tip portions, to the first lead 10. In the present embodiment, the first tip portion 25b is located closer to the second A surface 21 than the second tip portion 25c, and the first tip portion 25b is located closer to the second A surface 21 than to the second B surface 22.

In the present embodiment, a distance in the first direction x between the second end portion 22a and a tip end 25d of the first tip portion 25b of the second lead 20 is, for example, in a range of 10 μm to 1 mm. The tip end 25d of the first tip portion 25b refers to a point, within the first tip portion 25b, closest to the first lead 10 in the cross-sectional view. Further, a distance in the first direction x between the second end portion 22a and a tip end 25e of the second tip portion 25c of the second lead 20 is, for example, in a range of 10 μm to 1 mm. The tip end 25e of the second tip portion 25c refers to a point, within the second tip portion 25c, closest to the first lead 10 in the cross-sectional view. The tip end 25e of the second tip portion 25c is located at a position apart from the second B surface 22 by a distance in a range of 10 μm to 1 mm, for example, in the thickness direction of the second lead 20, and the tip end 25d of the first end portion 25b is located at a position apart from the second B surface 22 by a distance in a range of 10 μm to 1 mm, for example, in the thickness direction of the second lead 20.

In the second protrusion 25, it is preferable that a surface extending from the first end portion 21a to the first tip portion 25b of the second protrusion 25 include a curved surface 25a concavely curved toward the second B surface 22.

While the first tip portion 25b is located closer to the second A surface 21 side than the second tip portion 25c in the present embodiment, the second tip portion 25c may be located closer to the second A surface 21 than the first tip portion 25b. The number of tip portions included in the second protrusion 25 may be other than two.

The first protrusion 15 and the second protrusion 25 having the shapes described above can be formed, for example, by adjusting the characteristics, shape, positional relationship, and the like of a mask when a conductive member to serve as a material of the first lead 10 and the second lead 20 is processed by etching.

The bottom portion 4 is formed by disposing the first lead 10 and the second lead 20 having the shape as described above to be separate from each other by a desired distance, filling a molding resin at a periphery of the first lead 10 and the second lead 20, and then molding the molding resin. At this time, the first lead 10 and the second lead 20 are disposed such that the first end portion 11a of the first lead 10 and the first end portion 21a of the second lead 20 are separated from each other in the first direction x by a distance in a range of 50 μm to 5 mm, for example.

According to such a method of forming, a gap (first gap) 30 is formed between the resin body 5 and the first C surfaces 13, as illustrated in FIG. 2B. Likewise, a gap (second gap) 40 is formed between the resin body 5 and the second C surfaces 23. The first gap 30 and the second gap 40 are not formed entirely between the resin body 5 and the first C surfaces 13 and between the resin body 5 and the second C surfaces 23, but are formed partially therebetween intermittently or continuously. Accordingly, the resin body 5 and the first C surfaces 13 are at least partially in contact with each other, and the resin body 5 and the second C surfaces 23 are at least partially in contact with each other. Each of the first gap 30 and the second gap 40 has a width of, for example, equal to or less than 1 μm.

In order to simplify the drawings and to facilitate the understanding thereof, the first gap 30 and the second gap 40 illustrated in FIG. 2B are depicted with a substantially constant width between the resin body 5 and the first C surface 13 having the first protrusion 15, and between the resin body 5 and the second C surface 23 having the second protrusion 25, respectively. However, each of the first gap 30 and the second gap 40 includes a gap not having the constant width between the first C surface 13 and the resin body 5, and between the second C surface 23 and the resin body 5. In the first gap 30, for example, the first C surface 13 and the resin body 5 are partially in contact with each other and partially separated from each other, and those separated portions are continuously connected. The same applies to the second gap 40. The first gap 30 may be formed entirely between the first C surface 13 of the first lead 10 and the resin body 5, and the second gap 40 may be formed entirely between the second C surface 23 of the second lead 20 and the resin body 5.

In FIG. 2B, for facilitating the understanding of the drawing, the first gap 30 and the second gap 40 are each illustrated as a gap having a substantially constant width from the upper surface to the lower surface of the bottom portion 4. However, the first gap 30 and the second gap 40 are not necessarily continuous from the upper surface to the lower surface of the bottom portion 4. The widths of the first gap 30 and the second gap 40 are exaggerated in FIG. 2B.

It is preferable for the resin body 5 to be disposed while exposing the first B surface 12 of the first lead 10 and the second B surface 22 of the second lead 20. With this structure, heat generated in the light emitting device is easily transferred from the first lead 10 and the second lead 20 to a wiring substrate on which the light emitting device is mounted. Thus, heat dissipation of the light emitting device can be improved. Furthermore, with the structure in which the first B surface 12 of the first lead 10 and the second B surface 22 of the second lead 20 are exposed from the resin body 5, it is possible to prevent a portion of the lower surface of the first lead 10 and the lower surface of the second lead 20 to be bonded to the wiring substrate from being covered with the resin body 5, so that the first lead 10 and the second lead 20 can be bonded to electrodes of the wiring substrate with sufficient strength.

It is preferable for the protecting member to be located apart from the first B surface 12 and the second B surface 22. The first lead 10 and the second lead 20 of the light emitting device are bonded to the wiring substrate with a known bonding member such as solder. The bonding member such as solder generally has a higher thermal conductivity than that of the protecting member containing a resin material. With the protecting member is spaced apart from the first B surface 12 and the second B surface 22, the surface area of the bonding member, such as solder, directly covering the first B surface 12 and the second B surface 22 can be increased. Accordingly, the heat generated in the light emitting device is easily transferred from the first lead 10 and the second lead 20 to the wiring substrate on which the light emitting device is mounted, which allows for improving the heat dissipation of the light emitting device.

Next, the lateral wall portion 3 will be described with reference to FIGS. 2A and 4.

As illustrated in FIG. 4, the lateral wall portion 3 is disposed along the outer periphery of the bottom portion 4. The lateral wall portion 3 is disposed covering the first groove 16 of the first lead 10 and the second groove 26 of the second lead 20. With this structure, the contact area between the first lead 10 and the lateral wall portion 3, and the contact area between the second lead 20 and the lateral wall portion 3 are increased, so that the bonding strength between the first lead 10 and the lateral wall portion 3, and the bonding strength between the second lead 20 and the lateral wall portion 3 can be increased.

The lateral wall portion 3 disposed as described above surrounds, in a top view, a portion of the first A surface 11 of the first lead 10, a portion of the second A surface 21 of the second lead 20, and a portion of a surface of the resin body 5 disposed between the first lead 10 and the second lead 20. Accordingly, in a top plan view, the lateral wall portion 3 surrounds, of the first C surfaces 13 of the first lead 10, a portion 17 of one of the first C surfaces 13 that faces a corresponding one of the second C surfaces 23 of the second lead 20. It is desirable that the first protrusion 15 is formed over the entirety of the portion 17. With this structure, a length of a path of the gap between the first C surface 13 and the resin body 5 can be increased over the entirety of the portion 17. This allows for reducing entry of moisture into the light emitting device through the gap. In the top view, the lateral wall portion 3 disposed as described above surrounds, of the second C surfaces 23 of the second lead 20, a portion 27 of one of the second C surfaces 23 that faces the first C surface 13 of the first lead 10. It is desirable that the second protrusion 25 is formed over the entirety of the portion 27. With this structure, a length of a path of the gap between the second C surface 23 and the resin body 5 can be increased over the entirety of the portion 27.

Furthermore, in the present embodiment, as illustrated in FIG. 2A, an inner side surface 3a of the lateral wall portion 3 is inclined with respect to the upper surface of the bottom portion 4, and a thickness of the lateral wall portion 3 is gradually reduced in a direction in which a distance from the upper surface of the bottom portion 4 increases. The lateral wall portion 3 is formed of, for example, the same material as that of the resin body 5.

2. Protecting Member

The protecting member 50 is disposed continuously on at least a portion of the first A surface 11 and in at least a portion of the gap between the first protrusion 15 and the resin body 5. The specific positions of at least the part of the first A surface 11 and at least the part between the first protrusion 15 and the resin body 5 will become apparent from the method of forming the protecting member 50 to be described below.

As will be described below, a method of disposing the protecting member 50 in the first gap 30 includes depositing a solution to serve as a material of the protecting member 50 on the first A surface 11 and impregnating the solution into the first gap 30, or depositing the above solution in the first gap 30 from the first A surface 11 side.

When the solution is depositing on the first A surface 11 and is impregnated into the first gap 30, the solution flows into the first gap 30 through the first A surface 11, so that a portion of the solution continuous to a portion of the solution having flowed into the first gap 30 remains in the vicinity of the first gap 30 of the first A surface 11. That is, the "at least a portion of the first A surface 11" described above is a region in which the portion of the solution remains. Therefore, the "at least a portion of the first A surface 11" includes a portion of the first A surface 11 continuous to the first C surface 13 that has the first protrusion 15.

When depositing the solution in the first gap 30, the width of the first gap 30 is 1 μm or less, so that it is difficult to depositing the solution only in the first gap 30, and thus a portion of the solution having overflowed from the first gap 30 is located near the first gap 30 of the first A surface 11. That is, the "at least a portion of the first A surface 11" described above is a region in which the portion of the solution having overflowed from the first gap 30 is located. Therefore, also when the solution is depositing in the first gap 30, the "at least a portion of the first A surface 11" includes a portion of the first A surface 11 continuous to the first C surface 13 that has the first protrusion 15.

Meanwhile, the protecting member 50 disposed between the first protrusion 15 and the resin body 5 is formed by flowing the solution into the first gap 30 from the first A surface 11 side using any of a method in which the solution is impregnated into the first gap 30 from the first A surface 11 side and a method in which the solution is disposed in the first gap 30 from the first A surface 11 side.

With the first gap 30 formed along the first protrusion 15, the solution having flowed into the first gap 30 may remain in the intermediate portion of the first gap 30 depending on the shape of the first protrusion 15.

Figure 2C:
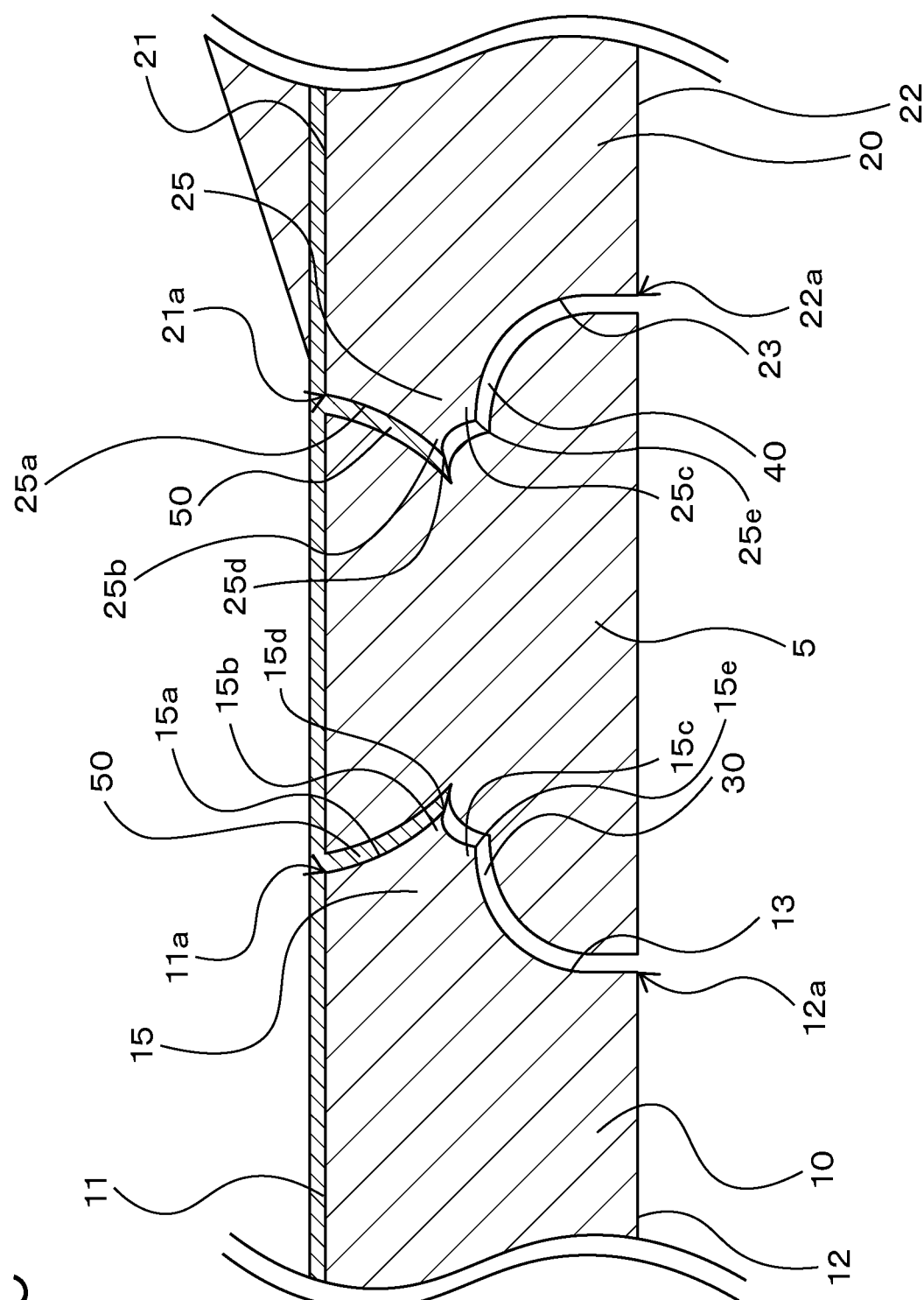
FIG. 2C is a schematic cross-sectional view illustrating an example of arrangement of a protecting member.

Specifically, as illustrated in FIG. 2C, for example, the solution having flowed into the first gap 30 remains at the first tip portion 15b of the first protrusion 15 or the tip end 15d of the first tip portion 15b, and thus is disposed on the first A surface 11 side relative to the first tip portion 15b. In other words, a first C surface 13 located below the first tip portion 15b of the first protrusion 15 or the tip end 15d of the first tip portion 15b is exposed from the protecting member 50.

Figure 2D:
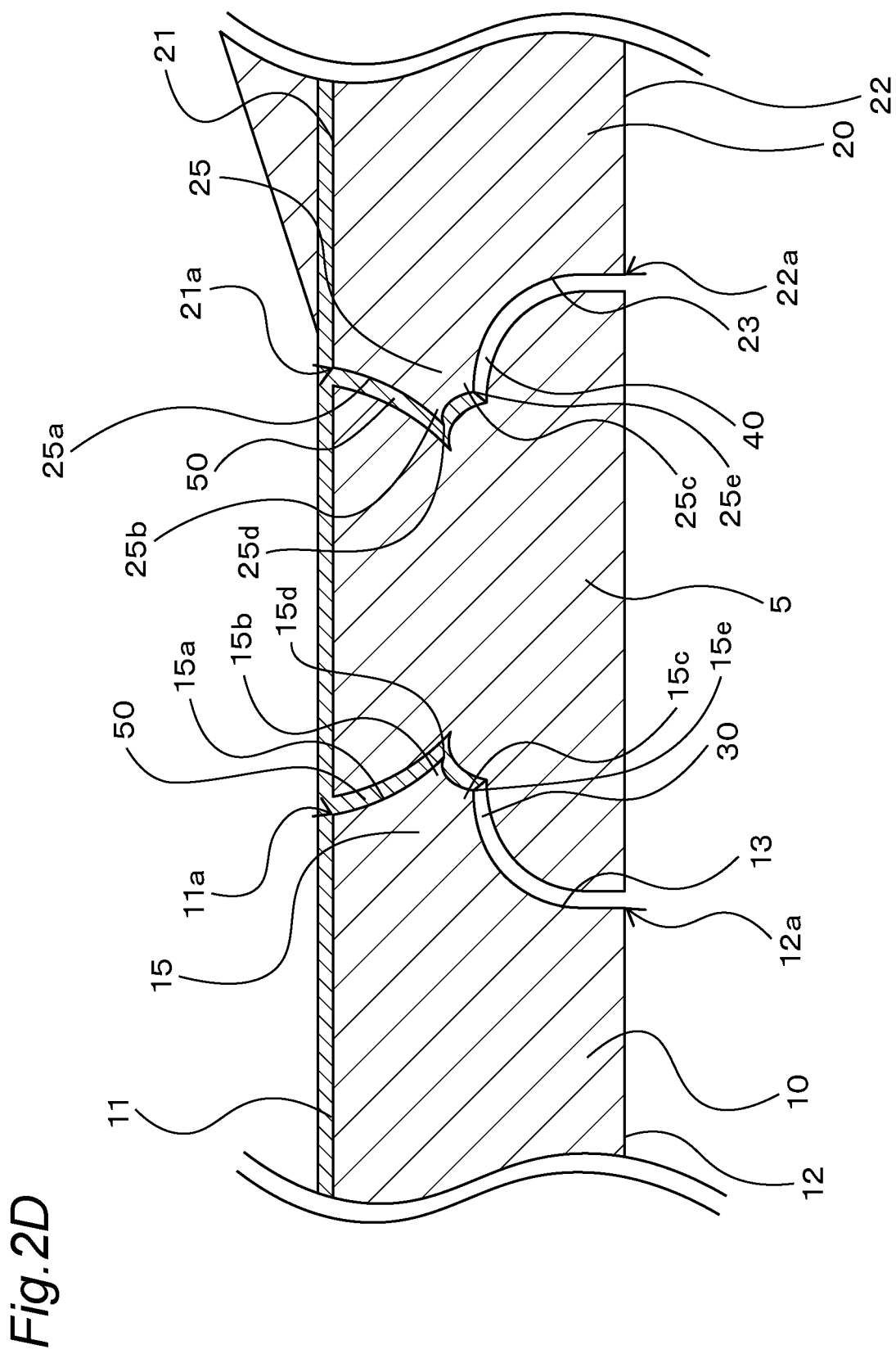
FIG. 2D is a schematic cross-sectional view illustrating an example of arrangement of the protecting member.

As illustrated in FIG. 2D, for example, the solution having flowed into the first gap 30 remains at the second tip portion 15c of the first protrusion 15 or the tip end 15e of the second tip portion 15c even when having passed through the first tip portion 15b of the first protrusion 15 or the tip end of the first tip portion 15b, and thus is disposed closer to the first A surface 11 than the second tip portion 15c.

Therefore, the "at least the portion between the first protrusion 15 and the resin body 5" includes a region located closer to the first A surface 11 side than the first tip portion 15b of the first protrusion 15 or the tip end 15d of the first tip portion 15b.

With the second gap 40 formed along the second protrusion 25, the solution having flowed into the second gap 40 may also remain in the intermediate portion of the second gap 40 depending on the shape of the second protrusion 25.

Specifically, as illustrated in FIG. 2C, for example, the solution having flowed into the second gap 40 remains at the first tip portion 25b of the second protrusion 25 or the tip end 25d of the first tip portion 25b, and thus is disposed closer to the first A surface 11 than the first tip portion 25b.

As illustrated in FIG. 2D, for example, the solution having flowed into the second gap 40 remains at the second tip portion 25c of the second protrusion 25 or the tip end 25e of the second tip portion 25c even when having passed through the first tip portion 25b of the second protrusion 25 or the tip end 25d of the first tip portion 25b, and is disposed on the first A surface 21 side relative to the second tip portion 25c.

The protecting member 50 disposed in the first gap 30 is in contact with the first protrusion 15 and the resin body 5. The protecting member 50 disposed in the second gap 40 is in contact with the second protrusion 25 and the resin body 5.

In the present embodiment, the protecting member 50 is disposed covering the upper surface of the bottom portion 4 (the first A surface 11, the second A surface 21, and a surface of the resin body 5) surrounded by the lateral wall portion 3, at least a portion of the inner lateral surface 3a of the lateral wall portion 3, and at least portions of lateral surfaces 60a of the light emitting element 60. With this configuration, a contact area between the protecting member 50 and the base 2 can be increased, which allows for preventing detachment of the protecting member 50 from the base 2.

Furthermore, in the present embodiment, the protecting member 50 is disposed covering a surface (lateral surfaces and/or upper surface) of the protecting element 70. Because the protecting element 70 can absorb light emitted from the light emitting element 60, covering surfaces of the protecting element 70 with the protecting member 50 allows for reducing absorption of light by the protecting element 70. Thus, the light extraction efficiency of the light emitting device 1 can be improved. Accordingly, it is desirable for the protecting member 50 to be disposed while covering the lateral surface and the upper surface of the protecting element 70.

In the accompanying drawings, for facilitating the understanding of the drawings, the protecting member 50 is disposed throughout the first gap 30 and the second gap 40. However, it is sufficient for the protecting member 50 to be disposed in at least a portion of each of the first gap 30 and the second gap 40. In the accompanying drawings, for facilitating the understanding of the drawings, the protecting member 50 is disposed over the entirety of the upper surface of the bottom portion 4 surrounded by the lateral wall portion 3. However, it is sufficient for the protecting member 50 to be disposed on at least a portion of the first A surface 11. On the other hand, as described above, at least a portion of the protecting member 50 disposed on the first A surface 11 and at least a portion of the protecting member 50 disposed in the first gap 30 are continuous with each other.

As described above, with the protecting member 50 disposed in the first gap 30 and the second gap 40, it is possible to prevent moisture from entering into the light emitting device 1 through the first gap 30 and the second gap 40.

While the first lead 10 and the second lead 20 include the protrusions (the first protrusion 15 and second protrusion 25, respectively) in the present embodiment as described above, it is also possible that either the first lead 10 or the second lead 20 has a protrusion. In this case, the protrusion is preferably provided in the first lead 10 on which the light emitting element 60 is disposed. With this structure, the protecting member 50 can be disposed in the first gap 30 closer to the light emitting element 60, and it is possible to more efficiently reduce the degradation in reliability of the light emitting device due to moisture that enters from the outside of the light emitting device 1.

The protecting member 50 contains a resin and particles.

The particles are preferably light reflective particles, for example. When the particles are light reflective particles, of the light emitted from the light emitting element 60, light radiated on the protecting member 50 disposed on the upper surface of the bottom portion 4 can be reflected toward an upper side (a light extraction direction) of the light emitting device 1, so that the light extraction efficiency can be improved.

Examples of the particles include titanium oxide, silicon oxide, aluminum oxide, and aluminum nitride. Examples of the resin include dimethyl silicone and phenyl silicone.

The specific gravity of the particles is preferably greater than that of the resin. This allows for facilitating sedimentation of particles in the resin. The sedimentation of particles facilitates disposing particles in the gap between the lead and the resin body. When a material that is less likely to transmit moisture than the resin, such as titanium oxide, is used for the particles, the particles disposed in the gap between the lead and the resin body allows for reducing entry of the moisture into the light emitting device.

In a cross-sectional view of the light emitting device 1, the total area of the particles is preferably in a range of 0.5 times to 100 times of the total area of the resin, and is more preferably in a range of five times to 80 times thereof. When a material that is less likely to transmit moisture than the resin, such as titanium oxide, is used for the particles, with the total area of the particles that is equal to or greater than 0.5 times the total area of the resin, it is possible to reduce entry of moisture into the light emitting device. With the total area of the particles that is equal to or greater than five times the total area of the resin, it is possible to further reduce entry of moisture into the light emitting device. With the total area of the particles that is equal to or less than 100 times the total area of the resin, each particle is likely to be covered with the resin. This allows for preventing separation between the particles. With the total area of the particles that is equal to or less than 80 times the total area of the resin, it is more likely to cover each particle with the resin. Furthermore, the average particle size of the particles is, for example, preferably in a range of 0.01 μm to 1 μm. With the average particle size of the particles being equal to or greater than 0.01 it is easy to settle the particles in the resin. With the average particle size of the particles being not greater than 1 the particles are easily disposed in the gap between the first C surface 13 and the resin body 5. The average particle size of the particles as used herein refers to the average value of particle diameters measured by the Fisher method using the Fisher Sub-Sieve Sizer (FSSS). For determining the average particle size using the Fisher method, for example, the Fisher Sub-Sieve Sizer Model 95 (available from Fisher Scientific) can be used.

Figure 5:
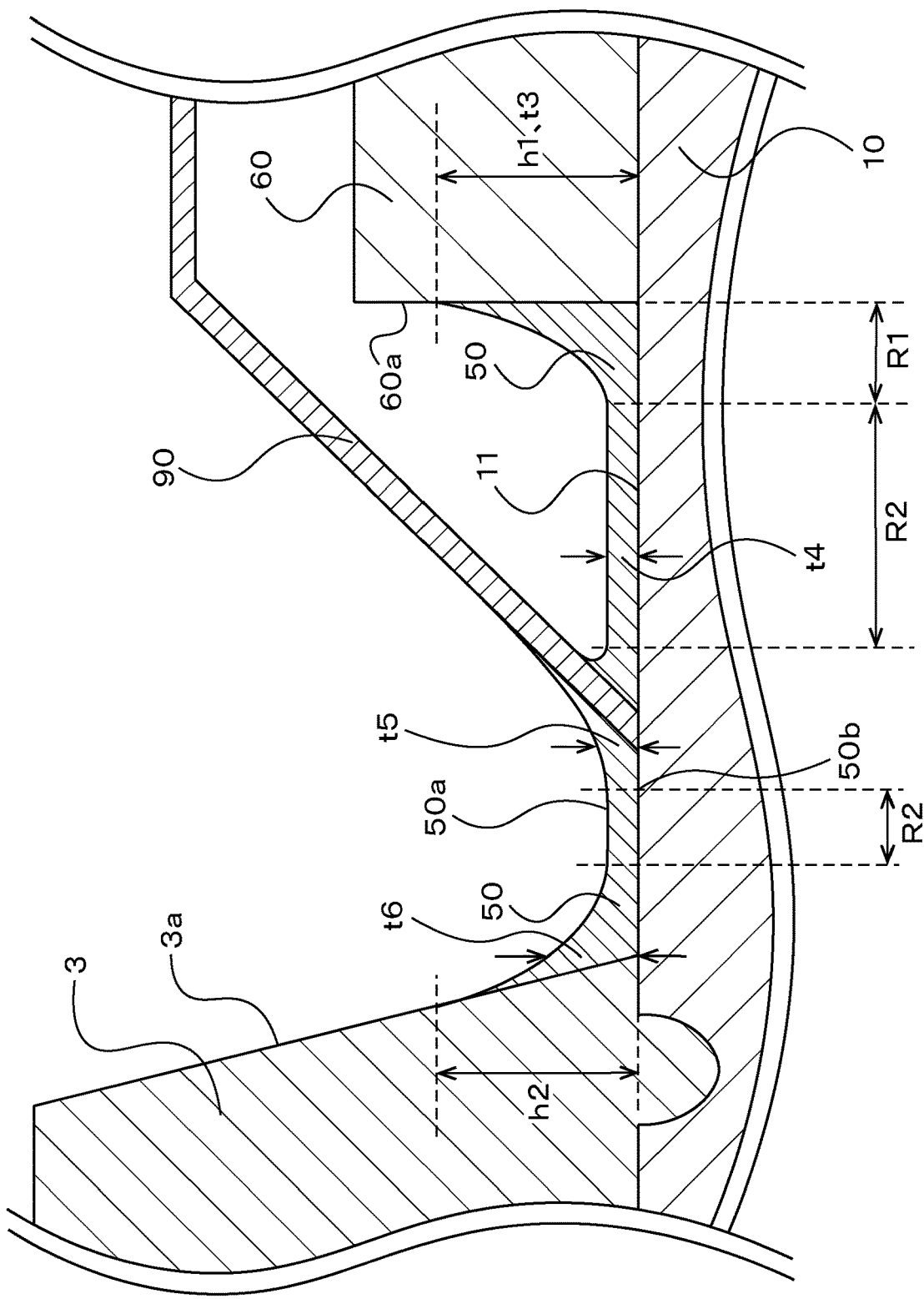
FIG. 5 is a schematic enlarged view of a portion of FIG. 2A.

As illustrated in FIG. 5, the protecting member 50 disposed on the first A surface 11 may cover at least a portion of the lateral surfaces 60a of the light emitting element 60 continuously from the upper side of the first A surface 11. With a structure in which at least a portion of the lateral surfaces 60a of the light emitting element 60 is covered with the protecting member 50, the light emitting element 60 can be prevented from being in contact with water in moisture. With this structure, corrosion of a semiconductor layer or electrodes of the light emitting element 60 can be prevented. In addition, the protecting member 50 disposed on the first A surface 11 may cover at least a portion of the inner lateral surface 3a of the lateral wall portion 3 continuously from the upper side of the first A surface 11. With this configuration, adhesion between the protecting member 50 and the base 2 is improved, which allows for preventing detachment of the protecting member 50 from the base 2.

As will be described below, after a solution containing a resin, particles, and a solvent is deposited to cover the first A surface and the lateral surface 60a of the light emitting element 60, volatilizing the solvent causes a maximum thickness t3 of the protecting member 50 disposed in a region (first region) R1 along the lateral surface 60a of the light emitting element 60 to be greater than an average thickness t4 of the protecting member 50 covering the first A surface 11 in a region (second region) R2 separate from the light emitting element 60. The maximum thickness t3 of the protecting member 50 disposed in the region R1 along the lateral surface 60a of the light emitting element 60 is, for example, in a range of five times to 50 times the average thickness t4 of the protecting member 50 covering the first A surface 11 in the region R2 separate from the light emitting element 60. The maximum thickness t3 of the protecting member 50 disposed in the region R1 along the lateral surface 60a of the light emitting element 60 is equal to or greater than five times the average thickness t4 of the protecting member 50 covering the first A surface 11 in the region R2 separate from the light emitting element 60, which allows for preventing the moisture from being in contact with the light emitting element 60. The maximum thickness t3 of the protecting member 50 disposed in the region R1 along the lateral surface 60a of the light emitting element 60 is equal to or less than 50 times the average thickness t4 of the protecting member 50 covering the first A surface 11 in the region R2 separate from the light emitting element 60, which allows for increasing an area of the lateral surface exposed from the protecting member 50 of the light emitting element 60. With this structure, light from the lateral surface of the light emitting element 60 is easily extracted, so that the light extraction efficiency of the light emitting device 1 can be improved.

The "region (second region) R2 separated from the light emitting element 60" is a region in which the thickness of the protecting member 50 is substantially constant and the surface thereof is flat. The expression "the protecting member 50 has a substantially constant thickness" as used herein refers to, for example, that a difference in thickness between the maximum thickness and the minimum thickness is within a range of ±10%. The "region (first region) R1 along the lateral surface 60a of the light emitting element 60" is a region continued to the second region R2, and where the protecting member 50 extends upward along the lateral surface 60a of the light emitting element 60. The first region R1 can also be referred to as a region extending from the lateral surface 60a of the light emitting element 60 to the second region R2. The first region R1 can also be referred to as a region extending from a position where the thickness of the protecting member 50 starts to increase from a substantially constant thickness to the lateral surface 60a of the light emitting element 60. The "thickness of the protecting member 50" refers to a distance from a lower surface 50b to an upper surface 50a of the protecting member 50.

A maximum thickness t5 of the protecting member 50 disposed on a wire 90 is smaller than the maximum thickness t3 of the protecting member 50 disposed in the first region R1. A maximum thickness t6 of the protecting member 50 disposed on the inner side surface 3a of the lateral wall portion 3 is smaller than the maximum thickness t3 of the protecting member 50 disposed in the first region R1.

As will be described below, after depositing a solution containing a resin, particles, and a solvent inward of the lateral wall portion 3, by volatilizing the solvent to form the protecting member, a maximum height h1 from the first A surface 11 of the protecting member 50 disposed in the first region R1 may be, for example, the same as a maximum height h2 from the first A surface 11 of the protecting member 50 covering the inner side surface 3a of the lateral wall portion 3. In the present specification, the expression "the maximum height h1 is the same as the maximum height h2" refers to that a difference in height between the maximum height h1 and the maximum height h2 is within a range of ±10%, for example. The term "the maximum height of the protecting member 50 from the first A surface 11" refers to a maximum distance between the first A surface 11 and the upper surface 50a of the protecting member 50.

3. Light Emitting Element

The light emitting element 60 includes semiconductor layers including an n-type semiconductor layer, a p-type semiconductor layer, and an active layer disposed between the n-type semiconductor layer and the p-type semiconductor layer. As illustrated in FIG. 2A, in the light emitting element 60 used in the present embodiment, a upper surface 60b serves as a light emitting surface, and there are provided a first electrode (for example, an n-side electrode connected to the n-type semiconductor layer) 61 and a second electrode (for example, a p-side electrode connected to the p-type semiconductor layer) 62 on the upper surface 60b. The light emitting element 60 is face-up mounted on the first A surface 11 of the first lead 10 such that the upper surface 60b, which is a light emitting surface, faces upward. A bonding member bonding the light emitting element 60 and the first lead 10 may be an insulative bonding member or a conductive bonding member. A known bonding member can be used for the bonding member. The first electrode 61 and the second electrode 62 of the light emitting element 60 are connected to the first lead 10 and the second lead 20 respectively, via the wire 90, for example. Because FIG. 2A illustrates a schematic cross-sectional view taken along a line II-II in FIG. 1, the wire 90 connected to the second electrode 62 is not shown in FIG. 2A.

The light emitting device 1 according to the present embodiment includes one light emitting element 60, but may include two or more light emitting elements 60.

4. Protecting Element

As illustrated in FIG. 2A, the protecting element 70 is disposed on the second A surface 21 of the second lead 20. The protecting element 70 is a so-called Zener diode. The protecting element 70 has, for example, a first electrode (for example, a p-side electrode) on a lower surface of the protecting element 70, and a second electrode (for example, an n-side electrode) on the upper surface of the protecting element 70. The protecting element 70 is connected to the first lead 10 via the wire 90, for example, and is connected to the second lead 20 via a solder.

Illustrations of the first electrode and the second electrode of the protecting element 70 are omitted in the drawings. Because FIG. 2A illustrates the schematic cross-sectional view taken along the line II-II in FIG. 1, the wire 90 connected to the second electrode of the protecting element 70 is not illustrated.

5. Reflecting Member

As illustrated in FIG. 2A, the reflecting member 80 is disposed covering the protecting element 70. With this structure, absorption of light emitted from the light emitting element 60 by the protecting element 70 can be reduced.

In the present embodiment, the reflecting member 80 is disposed on, for example, the second A surface 21 of the second lead 20 surrounded by the lateral wall portion 3. The reflecting member 80 may be disposed on surfaces of the resin body 5 surrounded by the lateral wall portion 3 and/or on the first A surface 11 of the first lead 10 instead of covering the light emitting element 60. In these cases, in regions of the second A surface 21, the surface of the resin body 5, and the first A surface 11 on which the protecting member 50 is disposed, the reflecting member 80 is disposed on the protecting member 50.

In the light emitting device 1 of the present embodiment, the reflecting member 80 may have substantially uniform thickness from the second A surface 21 (the upper surface of the base 2), but preferably, has a thickness that increases toward the lateral wall portion 3. With the reflecting member 80 having a thickness that increases toward the lateral wall portion 3 to have an inclined surface, the light emitted from the light emitting element 60 can be reflected upward (in the light extraction direction) by the inclined surface of the reflecting member 80, so that the extraction efficiency can be improved.

6. Sealing Member

The sealing member 95 is disposed in a region surrounded by the lateral wall portion 3 (hereinafter, also referred to as "inward of the lateral wall portion 3") while covering the lateral surfaces 60a and the upper surface 60b of the light emitting element 60.

The sealing member 95 may contain a phosphor. This allows for facilitating color adjustment of the light emitting device. One type of a phosphor or a plurality of types of phosphors may be contained in the sealing member 95. The phosphor contained in the sealing member 95 may be dispersed or may be unevenly distributed in the sealing member 95. A known material can be employed for the phosphor.

Examples of the phosphor include a fluoride-based phosphor such as an KSF-based phosphor, a nitride-based phosphor such as CASN, a YAG-based phosphor, and a β SiAlON phosphor. The KSF-based phosphor and the CASN are examples of wavelength conversion members configured to convert blue light to red light, and the YAG-based phosphor is an example of a wavelength conversion member configured to convert blue light to yellow light. The β SiAlON phosphor is an example of a wavelength conversion member configured to convert blue light to green light. The phosphor may be a quantum dot phosphor. For a base material for dispersing particles of a phosphor or the like, a silicone resin, a modified silicone resin, an epoxy resin, a modified epoxy resin, a urea resin, a phenol resin, an acrylic resin, a urethane resin, a fluororesin, or a resin containing two or more types of these resins can be used.

Second Embodiment

As illustrated in FIGS. 6 to 9, a light emitting device 100 according to the present embodiment differs from the light emitting device 1 according to the first embodiment in that a light emitting element is face-down mounted. Shapes of a first lead 110 and a second lead 120 in the light emitting device 100 according to the present embodiment differs from the shapes of the first lead 10 and the second lead 20 in the light emitting device 1 according to the first embodiment. Configurations different from those in the first embodiment will be described below.

Figure 8:
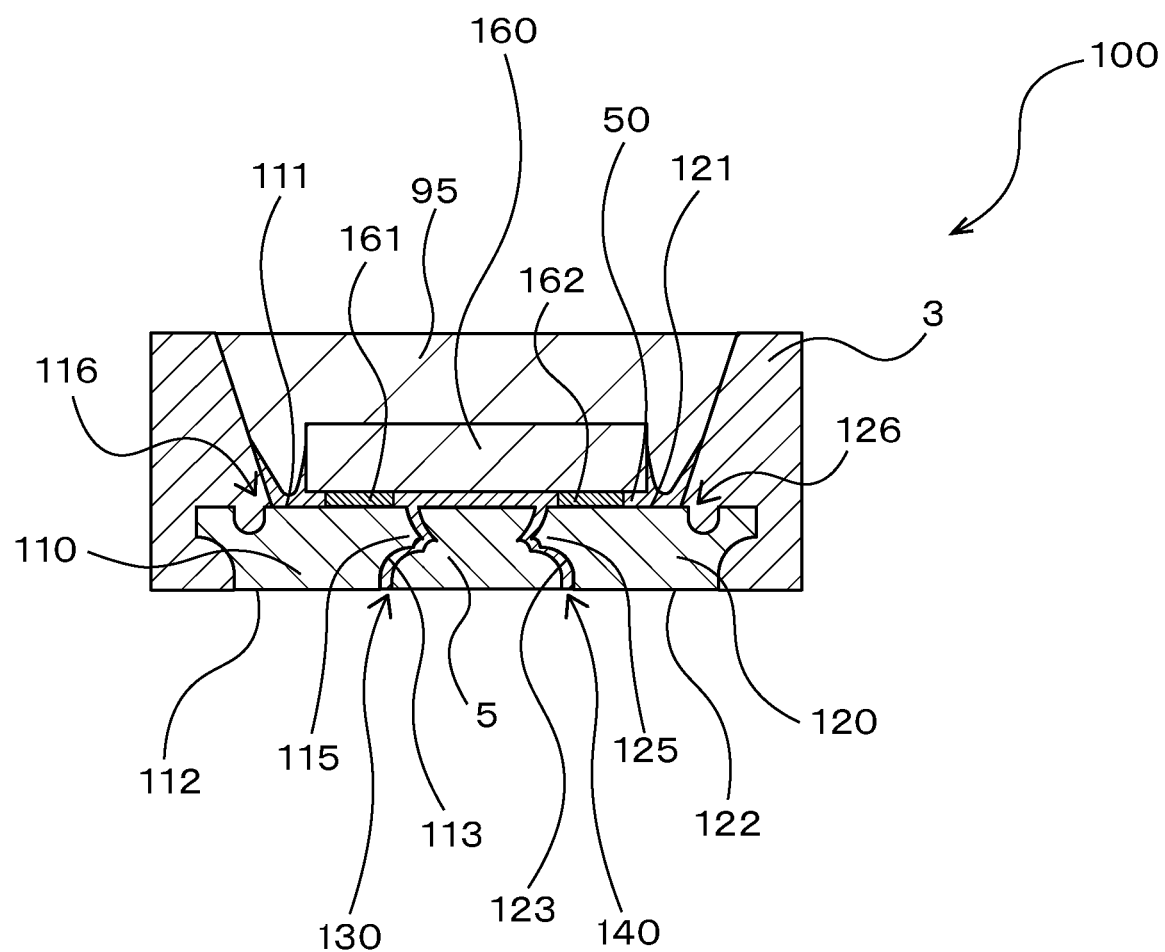
FIG. 8 is a schematic cross-sectional view taken along a line VIII-VIII in FIG. 6.

As illustrated in FIG. 8, the first lead 110 includes a first A surface (upper surface) 111, a first B surface (lower surface) 112 on the opposite side to the first A surface 111, and first C surfaces 113 located between the first A surface 111 and the first B surface 112 and including at least one first protrusion 115. The second lead 120 includes a second A surface (upper surface) 121, a second B surface (lower surface) 122 on the opposite side to the second A surface 121, and second C surfaces 123 located between the second A surface 121 and the second B surface 122 and including at least one second protrusion 125.

Figure 9:
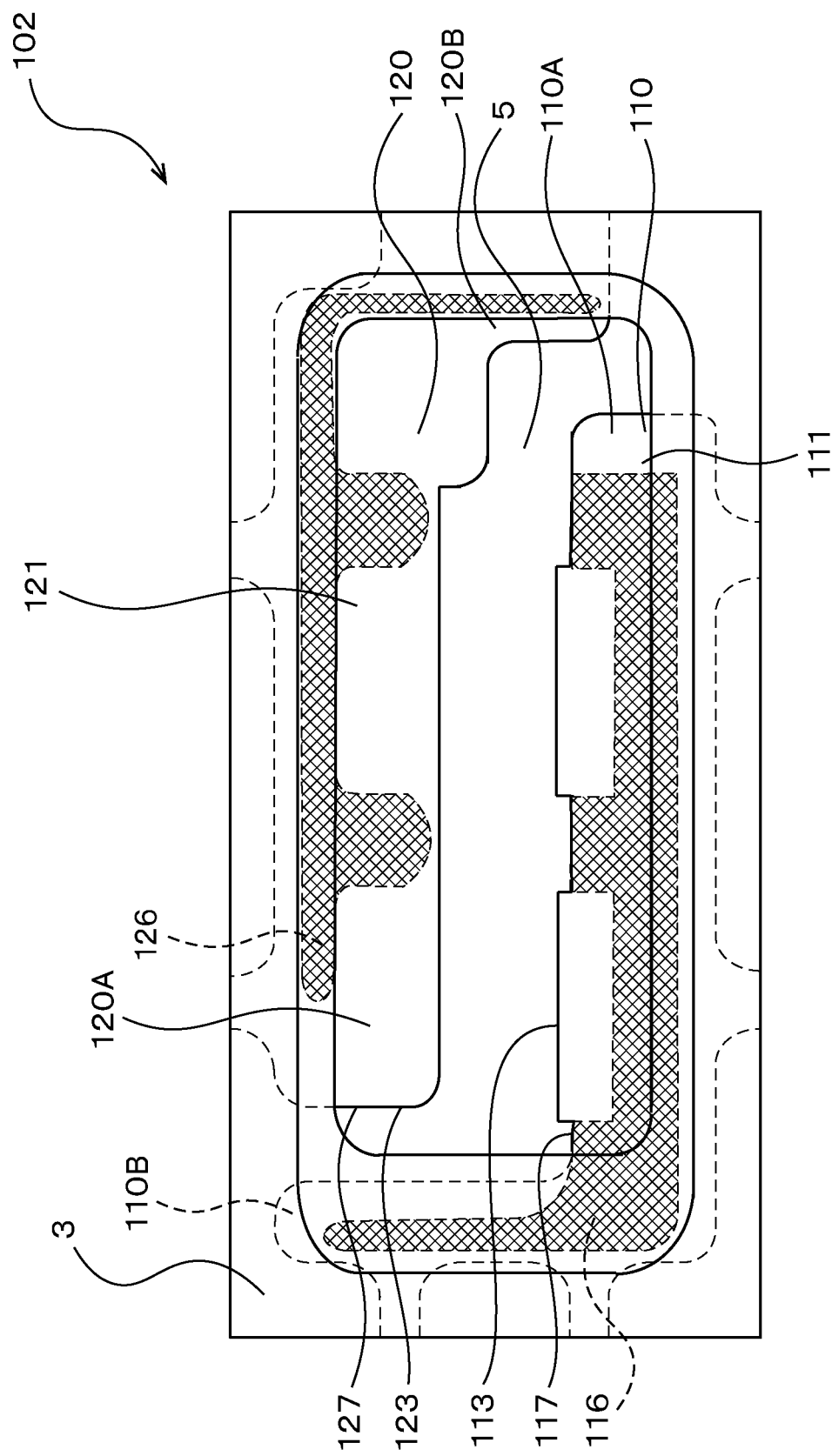
FIG. 9 is a schematic top view of a base according to the light emitting device in FIG. 6.

As illustrated in FIG. 9, in a top view, the first lead 110 is a flat plate shape having a first portion 110A extending in a long side direction, and a second portion 110B connected to one end portion of the first portion 110A and extending in a short side direction. One end portion of the second portion 110B is connected to the end portion of the first portion 110A.

As illustrated in FIG. 9, in a top view shape, the second lead 120 is a flat plate having a first portion 120A extending in the long side direction, and a second portion 120B connected to one end portion of the first portion 120A and extending in the short side direction. One end portion of the second portion 120B is connected to the end portion of the first portion 120A.

The area of the first lead 110 and the area of the second lead 120 in the top view are substantially the same.

As indicated by shading in FIG. 9, also in the present embodiment, the first lead 110 defines a first groove 116 in the first A surface 111 in order to increase the bonding strength with a lateral wall portion 3. The first groove 116 is defined along, for example, the first portion 110A and the second portion 110B in the top view. Likewise, the second lead 120 defines a second groove 126 on the second A surface 121 in order to increase the bonding strength with the lateral wall portion 3. The second groove 126 is defined along the first portion 120A and the second portion 120B in the top view, for example.

Figure 7:
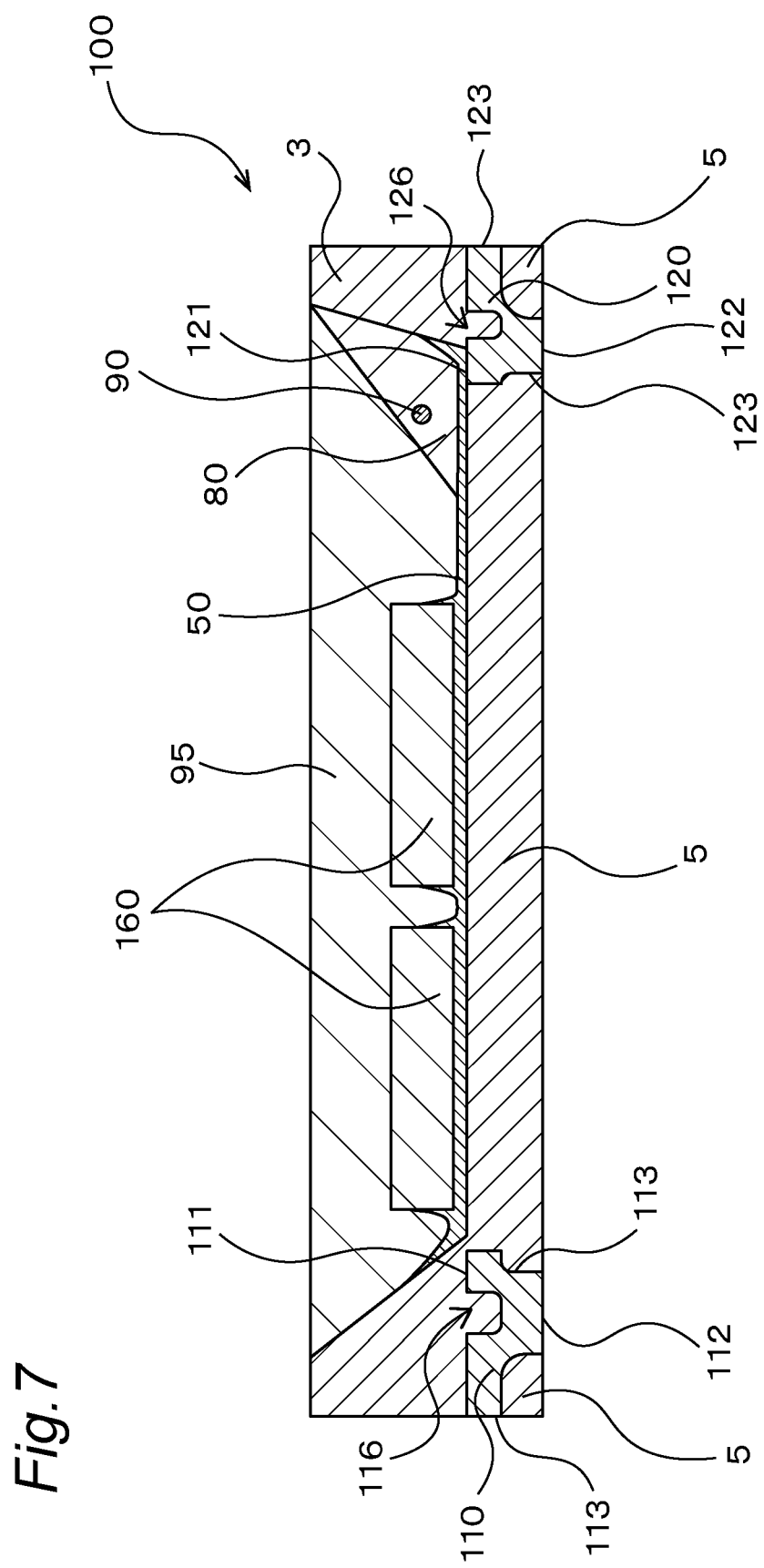
FIG. 7 is a schematic cross-sectional view taken along a line VII-VII in FIG. 6.

As illustrated in FIG. 9, the first lead 110 and the second lead 120 are spaced apart. In the short side direction, the first portion 110A of the first lead 110 and the first portion 120A of the second lead 120 face each other. In the long side direction, the second portion 110B of the first lead 110 faces the first portion 120A and the second portion 120B of the second lead 120. In the long side direction, the second portion 120B of the second lead 120 faces the first portion 110A and the second portion 110B of the first lead 110. The first lead 110 and the second lead 120 are held by a resin body 5, which is disposed covering corresponding ones of the first C surfaces 113 of the first lead 110 and corresponding ones of the second C surfaces 123 of the second lead 120. However, as illustrated in FIG. 7, portions of the corresponding first C surfaces 113 and portions of the corresponding second C surfaces 123 are exposed from the resin body 5.

Figure 6:
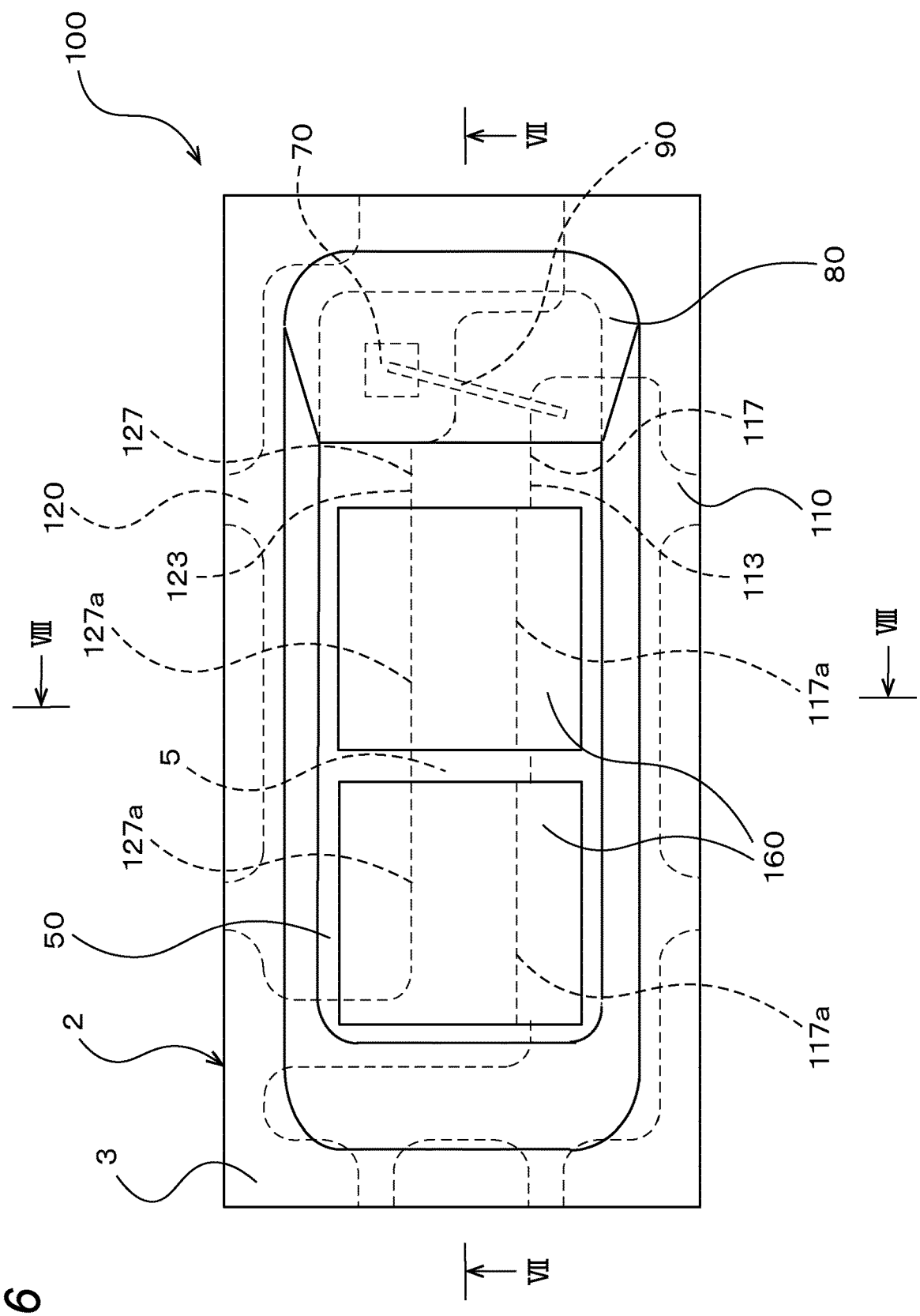
FIG. 6 is a schematic top view of a light emitting device according to a second embodiment.

As illustrated in FIG. 8, in the light emitting element 160, an upper surface of the light emitting element 160 serves as a light emitting surface, and a first electrode (for example, an n-side electrode connected to an n-type semiconductor layer) 161 and a second electrode (for example, a p-side electrode connected to a p-type semiconductor layer) 162 are disposed on a lower surface of the light emitting element 160 opposite to the upper surface. One electrode (for example, the first electrode 161) of the light emitting element 160 is electrically connected to the first lead 110, and the other electrode thereof (for example, the second electrode 162) is electrically connected to the second lead 120. As illustrated in FIG. 6, the light emitting element 160 is disposed to overlap with the first lead 110 and the second lead 120 in a top view.

While two light emitting elements 160 are disposed in the present embodiment, the number of light emitting elements may be other than two.

As illustrated in FIG. 8, also in the light emitting device 100 configured as described above, one of the first C surfaces 113 that faces a corresponding one of the second C surfaces 123 of the second lead 120 has the first protrusion 115. In the present embodiment, a portion 117 (see FIGS. 6 and 9) of the first C surface 113 surrounded by the lateral wall portion 3 in a top view has the first protrusion 115. As illustrated in FIG. 8, one of the second C surfaces 123 that faces a corresponding one of the first C surfaces 113 of the first lead 110 has the second protrusion 125. In the present embodiment, a portion 127 (see FIGS. 6 and 9) of the second C surface 123 surrounded by the lateral wall portion 3 in the top view has the second protrusion 125.

In particular, it is preferable that a portion 117a of the first C surface 113 overlapping with the light emitting element 160 in the top view has the first protrusion 115, and that a portion 127a of the second C surface 123 overlapping with the light emitting element 160 in the top view has the second protrusion 125. With this structure, a protecting member 50 can be disposed in a first gap 130 and a second gap 140 formed below the light emitting element 160, which allows for more efficiently preventing the degradation in reliability of the light emitting device due to the moisture that enters from the outside of the light emitting device.

The relationship between the maximum thickness t3 of the protecting member 50 disposed in the first region R1 and the average thickness t4 of the protecting member 50 disposed in the second region R2 is similar to that in the first embodiment, and therefore detailed description thereof is omitted. Also, the relationship between the maximum height h1 from the first A surface 111 of the protecting member 50 in the first region R1 and the maximum height h2 from the first A surface 111 of the protecting member 50 covering the inner side surface 3a of the lateral wall portion 3 is similar to that of the first embodiment, and therefore detailed description thereof is omitted.

Method of Manufacturing

Next, a method of manufacturing a light emitting device according to one embodiment will be described.

The method of manufacturing the light emitting device according to the present embodiment includes:
(1) providing a base;
(2) disposing a light emitting element on a first A surface;
(3) disposing a protecting element on a second A surface;
(4) disposing a solution containing resin, particles, and a solvent between a first protrusion and a resin body;
(5) volatilizing the solvent;
(6) disposing a reflecting member; and
(7) disposing a sealing member.

(1) Providing of Base

As illustrated in FIG. 10A, the bottom portion 4 including the first lead 10, the second lead 20, and the resin body 5 is formed. The first lead 10 and the second lead 20 are disposed to be separated from each other by a desired distance, such that a first C surface 13 in which the first protrusion 15 is provided and a second C surface 23 in which the second protrusion 25 is provided are made to face each other. Subsequently, a molding resin is filled on the periphery of the first lead 10 and the second lead 20, and then the molding resin is cured to obtain the bottom portion 4. The cured molding resin serves as the resin body 5. When curing the molding resin, the first gap 30 is formed between the first lead 10 and the resin body 5, and the second gap 40 is formed between the second lead 20 and the resin body 5.

Subsequently, as illustrated in FIG. 10B, the lateral wall portion 3 is formed along the outer periphery the bottom portion 4. The lateral wall portion 3 is disposed covering the first groove 16 and the second groove 26. As illustrated in FIG. 4, the lateral wall portion 3 is disposed surrounding, among the first C surfaces 13 of the first lead 10, a portion 17 of one of the first C surfaces 13 that faces a corresponding one of the second C surfaces 23 of the second lead 20. In other words, the lateral wall portion 3 is disposed to surround a portion of the first C surface 13 in which the first protrusion 15 is formed in a top view. Thus, the base 2 including the lateral wall portion 3 disposed to surround the portion of the first C surface 13 in which the first protrusion 15 is provided in the top view can be provided. In the top view, it is preferable that the entirety of the portion of the first C surface 13 surrounded by the lateral wall portion 3 include the first protrusion 15. With this structure, the moisture resistance of the light emitting device can be further improved.

As illustrated in FIG. 4, the lateral wall portion 3 is disposed surrounding, among the second C surfaces 23 of the second lead 20, a portion 27 of one of the second C surfaces 23 that faces the first C surface 13 of the first lead 10. In other words, the lateral wall portion 3 is disposed to surround the portion 17 of the second C surface 23 in which the second protrusion 25 is provided in the top view. Furthermore, it is preferable that the entirety of the portion of the second C surface 23 surrounded by the lateral wall portion 3 include the second protrusion 25.

The same molding resin as the material of the resin body 5 can be used for the lateral wall portion 3. The lateral wall portion 3 is formed by using a mold, for example.

The lateral wall portion 3 may be integrally molded with the base 2. Alternatively, the base 2 may be provided by purchasing a manufactured product having a structure as described above.

(2) Disposing of Light Emitting Element on First A Surface

Figure 10C:
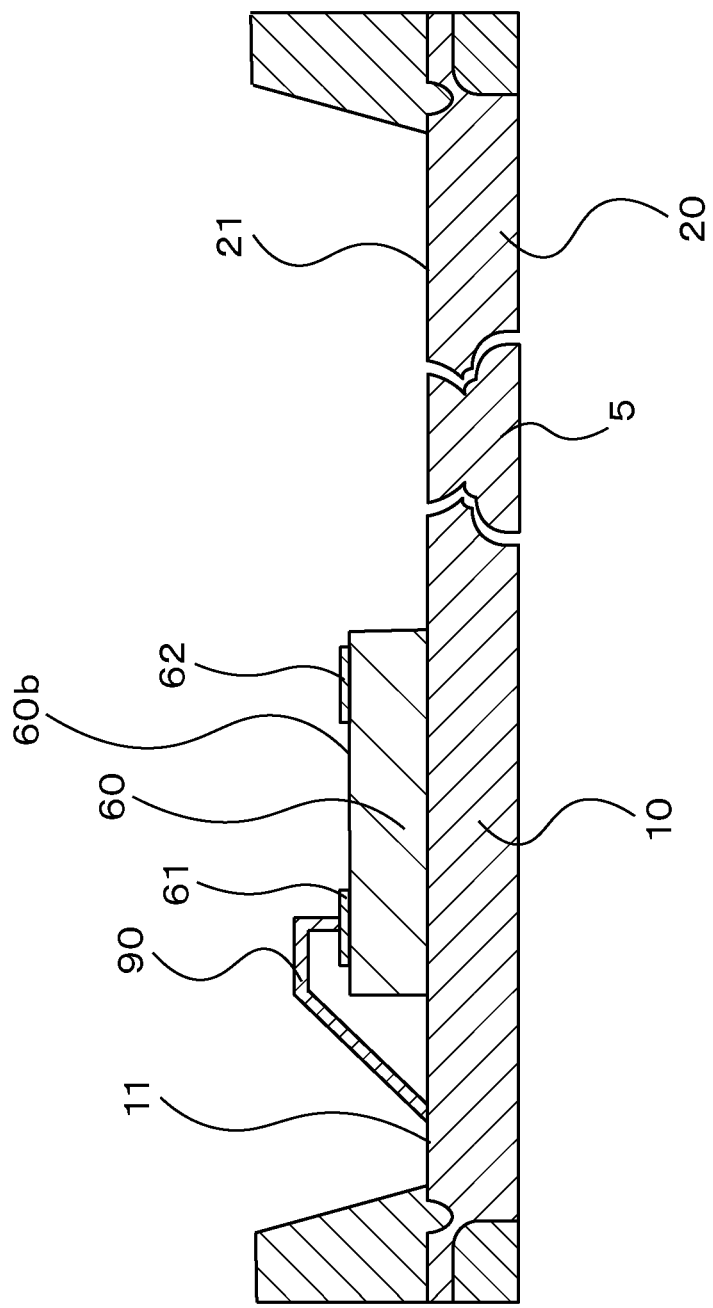
FIG. 10C is a schematic cross-sectional view illustrating an example of a manufacturing process for the light emitting device according to the first embodiment.

Subsequently, as illustrated in FIG. 10C, the light emitting element 60 is disposed on the first A surface 11 of the first lead 10. The light emitting element 60 is face-up mounted such that the upper surface 60b, which is a light emitting surface, faces upward. The light emitting element 60 is bonded to the first A surface 11 by a silicone resin, for example. In the light emitting element 60, the first electrode 61 is connected to the first lead 10 via, for example, a wire 90, and the second electrode 62 is connected to the second lead 20 via, for example, another wire 90. The wire 90 connecting the second electrode 62 and the second lead 20 is not illustrated in FIG. 10C.

When manufacturing the light emitting device 100 including the light emitting element 160 to be face-down mounted as in the second embodiment, the light emitting element 160 is disposed across the first lead 110 and the second lead 120 such that the upper surface of the light emitting element 160 serving as a light emitting surface faces upward, and the first electrode 161 and the second electrode 162 disposed on the lower surface of the light emitting element 160 can be bonded to the first A surface 111 of the first lead 110 and the second A surface 121 of the second lead 120, respectively, by a known material such as solder or an AuSn-based alloy. In particular, it is preferable for the light emitting element 160 be disposed to overlap with the first protrusion 115 and the second protrusion 125 in a top view.

(3) Disposing of Protecting Element on Second a Surface

Figure 10D:
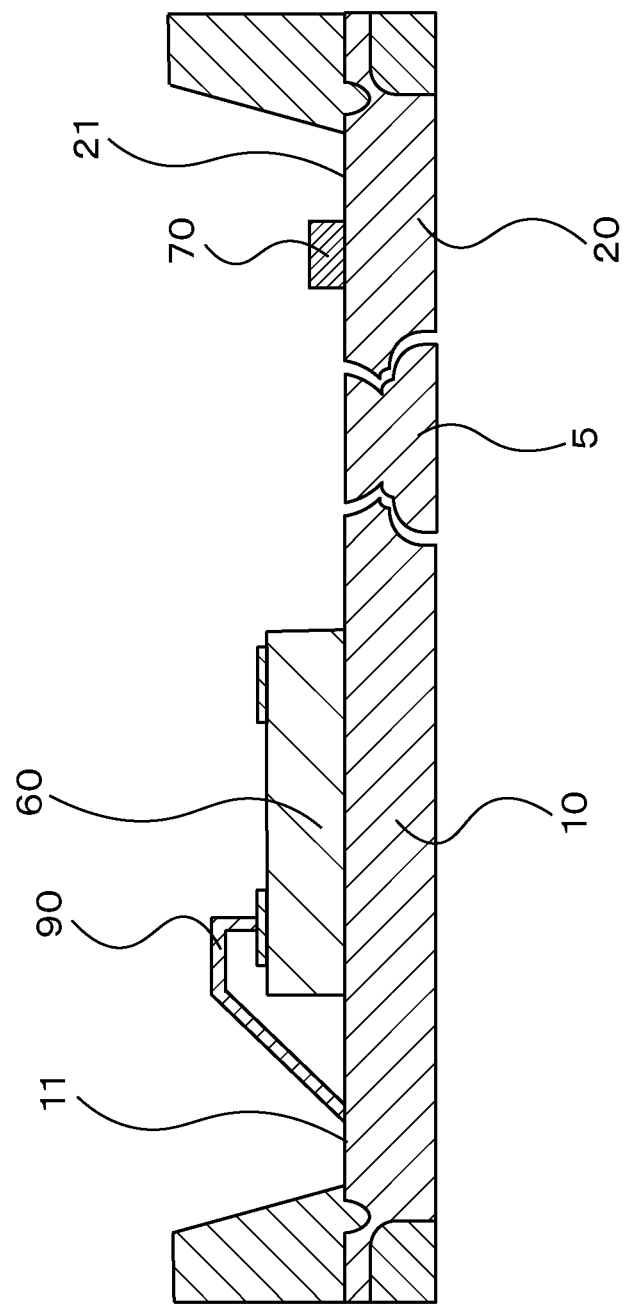
FIG. 10D is a schematic cross-sectional view illustrating an example of a manufacturing process for the light emitting device according to the first embodiment.

Subsequently, as illustrated in FIG. 10D, the protecting element 70 is disposed on the second A surface 21 of the second lead 20. In the protecting element 70, a first electrode disposed on the upper surface of the protecting element 70 is connected to the first lead 10 via, for example, a wire 90, and a second electrode disposed on the lower surface of the protecting element 70 is connected to the second lead 20 via, for example, solder. The first electrode, the second electrode, and the wire 90 connecting the protecting element 70 and the first lead 10 are not illustrated in FIG. 10D.

Figure 10E:
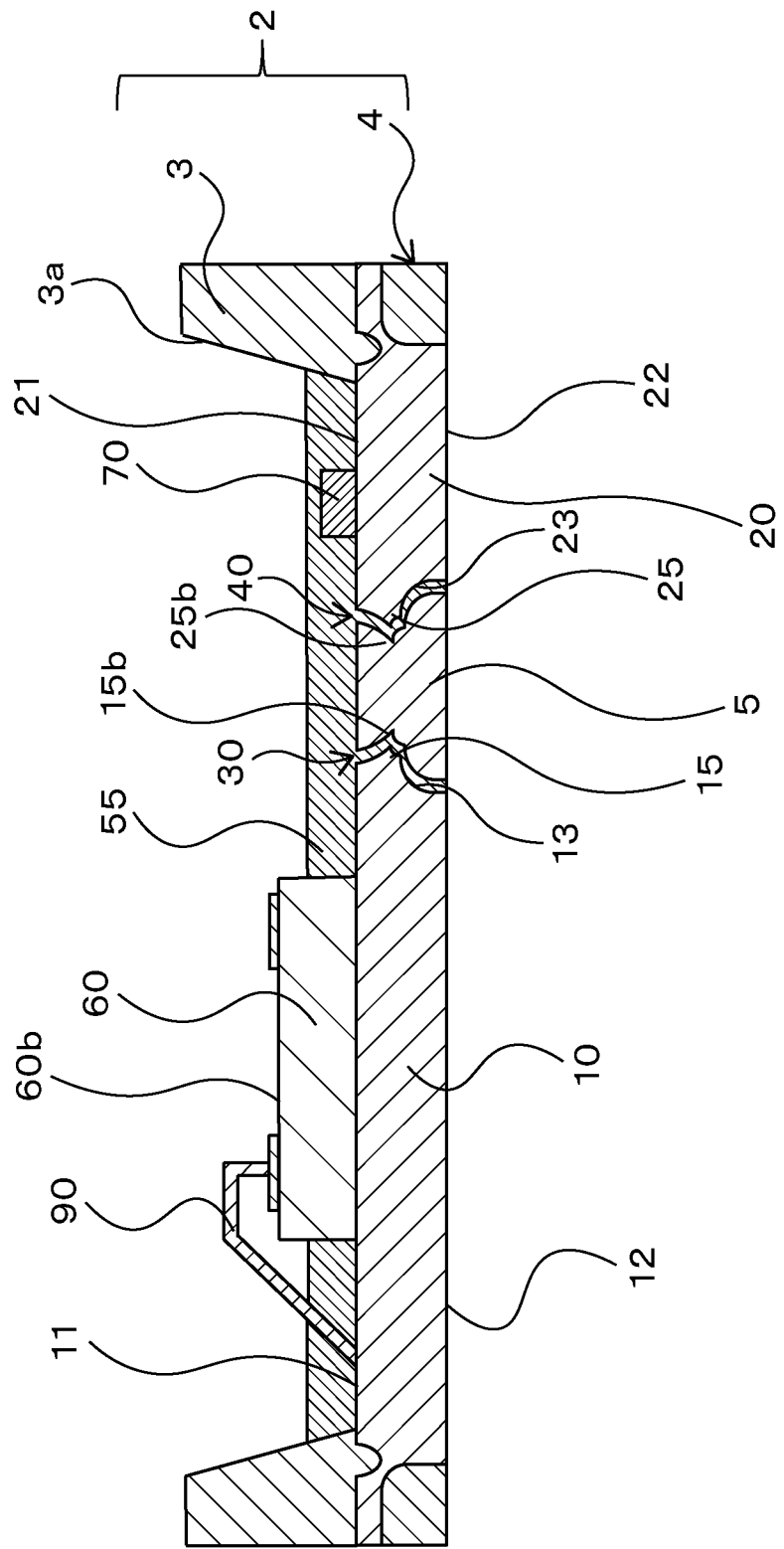
FIG. 10E is a schematic cross-sectional view illustrating an example of a manufacturing process for the light emitting device according to the first embodiment.

(4) Depositing of Solution Containing Resin, Particles, and Solvent Between First Protrusion and Resin Body Subsequently, as illustrated in FIG. 10E, a solution 55 is deposited inward of the lateral wall portion 3 such that the upper surface 60b of the light emitting element 60 is exposed.

The solution 55 contains resin, a solvent, and particles. The specific gravity of the particles is preferably greater than that of the resin. When the specific gravity of the particles is greater than that of the resin, the particles are more likely to sediment than the resin, and are likely to be filled in the first gap 30 and the second gap 40. Examples of the resin include dimethyl silicone and phenyl silicone. The solvent is a volatile solvent, and is, for example, tridecane. In general, the viscosity of a solvent is lower than that of the resin before being cured. Accordingly, the viscosity of the solution 55 can be decreased by containing a solvent in the solution 55. This allows for facilitating filling the solution to the first gap 30 and the second gap 40. The amount of solvent in the solution 55 may be greater than the amount of resin. This allows for facilitating decrease in the viscosity of the solution 55. The amount of solvent in the solution 55 may be smaller than the amount of resin. Accordingly, the amount of solvent that volatilizes is reduced, which allows for reducing a variation in the shape of the protecting member 50. The particles are, for example, light reflective particles, and are formed of titanium oxide, for example.

The solution 55 is disposed on the inner side of the lateral wall portion 3 by, for example, application. At this time, disposing the solution 55 on the inner side of the lateral wall portion 3 in contact with, for example, the inner lateral surface 3a of the lateral wall portion 3 allows for reducing variation in the shape of the solution 55 to be disposed.

The solution 55 deposited on the inner side of the lateral wall portion 3 in this manner is impregnated into the first gap 30 between the first protrusion 15 and the resin body 5. At this time, the solution 55 is also impregnated into the second gap 40 between the second protrusion 25 and the resin body 5.

When the solution 55 is impregnated into the first gap 30 and the second gap 40 to be disposed therein, the solution 55 may remain in the intermediate portion of each of the first gap 30 and the second gap 40. In particular, when the first protrusion 15 and the second protrusion 25 have a shape including a bent portion in a cross-sectional view, the solution 55 is impregnated downward to the bent portion and can remain at the bent portion. That is, the solution 55 is impregnated down to the first tip portion 15b (or second tip portion 15c) of the first protrusion 15 and to the first tip portion 25b (or second tip portion 25c) of the second protrusion 25, and can remain at the first tip portion 15b (or second tip portion 15c) and the first tip portion 25b (or second tip portion 25c). Accordingly, impregnating the solution 55 into the first gap 30 and the second gap 40 as described above allows for preventing the first B surface 12 and the second B surface 22 from being covered by the solution 55.

The solution 55 may be impregnated into the whole first gap 30 and second gap 40, but it is preferable that none of the first B surface 12 and the second B surface 22 are covered by the solution 55.

The solution 55 may be directly deposited in the first gap 30 and the second gap 40 by using, for example, a dropper, instead of depositing the solution in the first gap 30 and the second gap 40 by impregnation.

(5) Volatilizing of Solvent

Figure 10F:
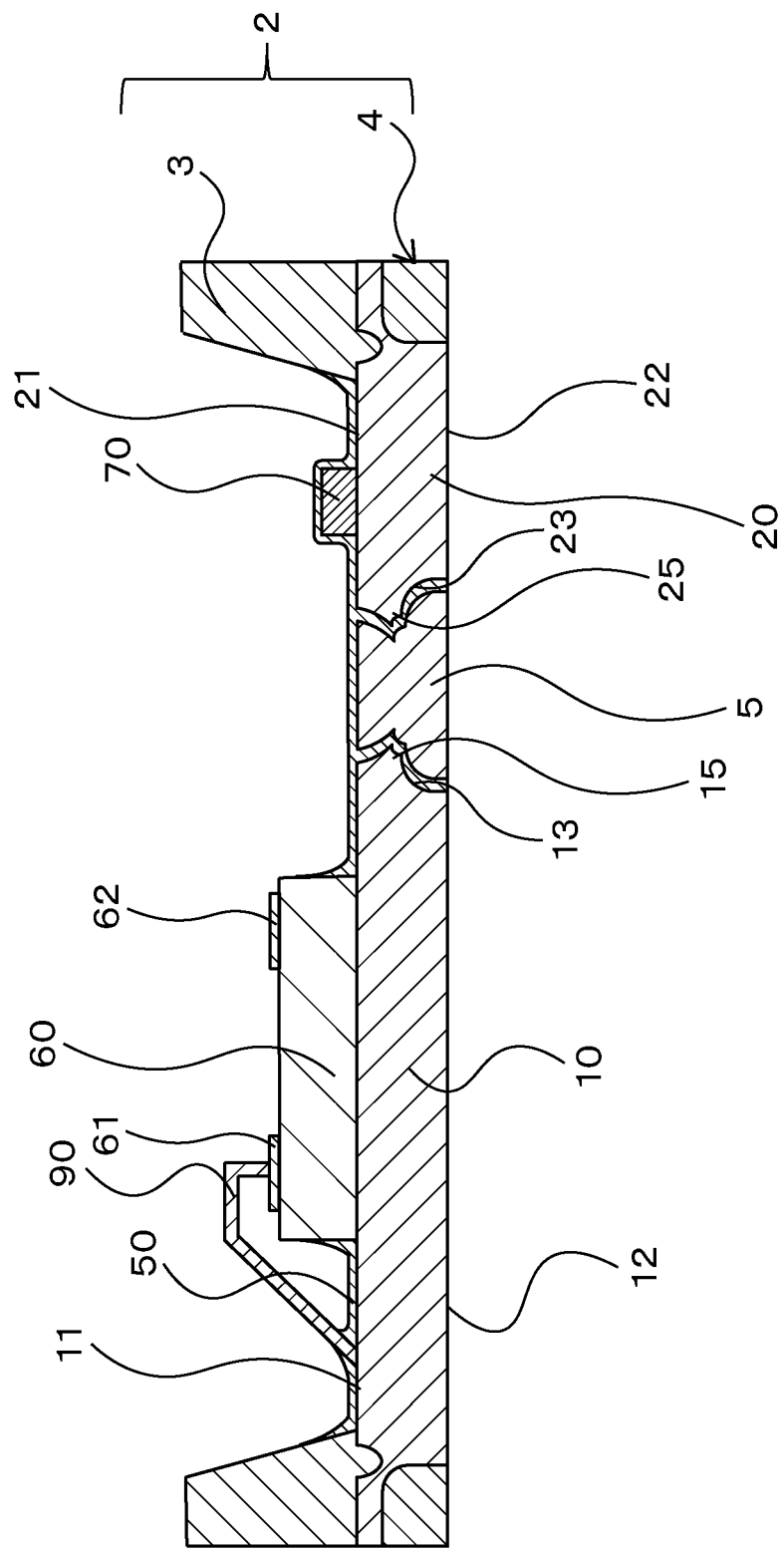
FIG. 10F is a schematic cross-sectional view illustrating an example of a manufacturing process for the light emitting device according to the first embodiment.

Subsequently, the solvent is volatilized from the solution 55 disposed on the inner side of the lateral wall portion 3. Examples of a method for volatilizing the solvent include storing the solution for approximately 30 to 250 minutes in an environment in a range of 50° C. to 70° C., or storing the solution for at least 48 hours in a normal temperature environment (approximately 25° C.). When the solvent is volatilized, the resin and particles remain in the portion where the solution 55 is previously disposed, and are disposed as the protecting member 50, as illustrated in FIG. 10F. Specifically, the protecting member 50 is disposed continuously on at least a portion of the first A surface 11 and in at least a portion between the first protrusion 15 and the resin body 5 (the first gap 30). Further, the protecting member 50 may be disposed covering the lateral surfaces 60a of the light emitting element 60 and the inner lateral surface 3a of the lateral wall portion 3.

As described above, when the specific gravity of the particles is greater than that of the resin, the particles are likely to be filled in the first gap 30 and the second gap 40, and therefore the first gap 30 and the second gap 40 are closed by the protecting member 50 formed by the solvent being volatilized.

As described above, when the first B surface 12 and the second B surface 22 are not covered by the solution 55, the protecting member 50 is not formed on the first B surface 12 and the second B surface 22. Accordingly, the areas of the first B surface 12 and the second B surface for connecting to the wiring substrate can be sufficiently secured.

(6) Disposing of Reflecting Member

Figure 10G:
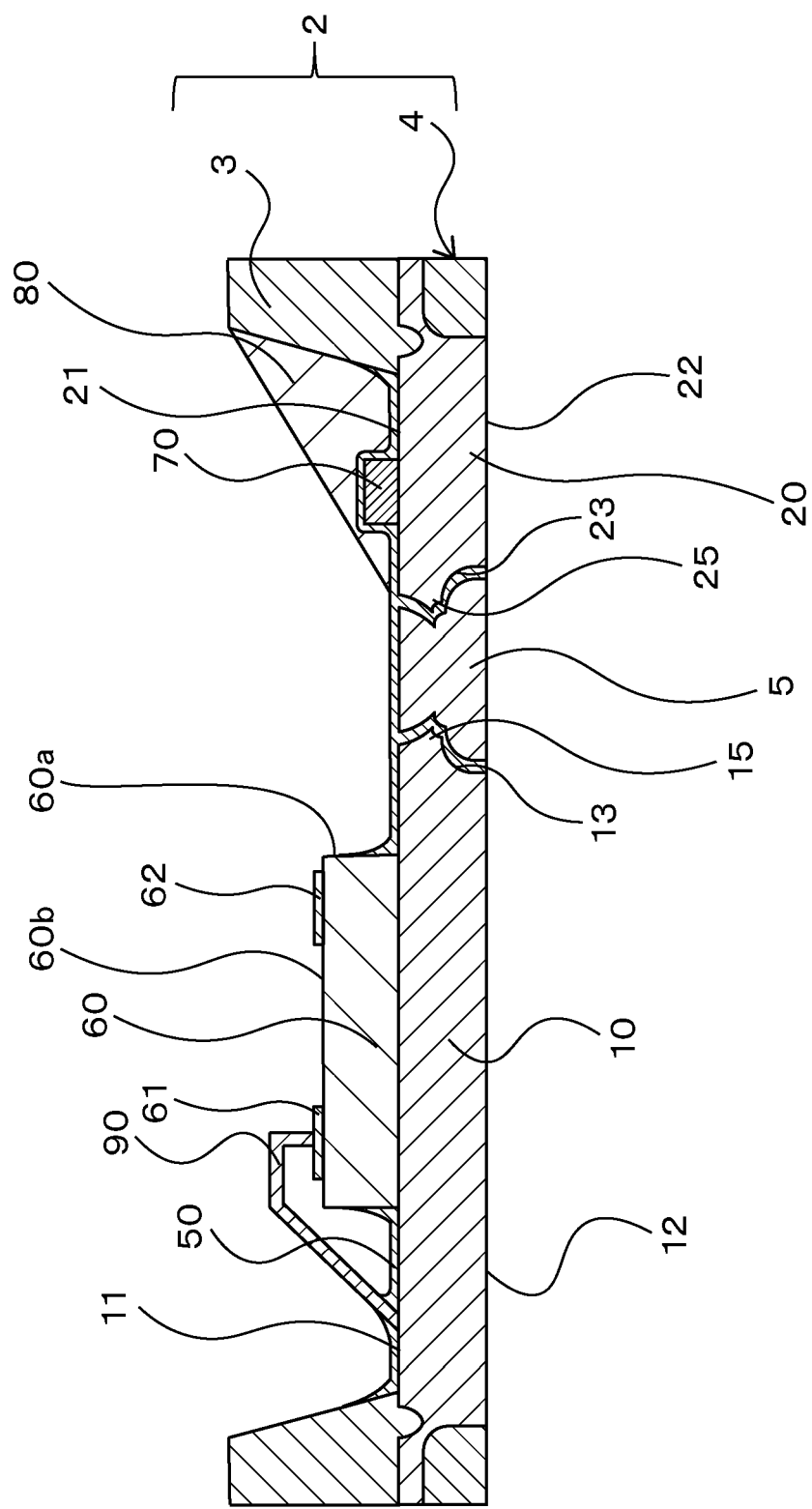
FIG. 10G is a schematic cross-sectional view illustrating an example of a manufacturing process for the light emitting device according to the first embodiment.

Subsequently, as illustrated in FIG. 10G, the reflecting member 80 is disposed on the inner side of the lateral wall portion 3, on the upper surface of the bottom portion 4 of the base 2. In the present embodiment, the reflecting member 80 is disposed on the second A surface 21 of the second lead 20 surrounded by the lateral wall portion 3 and covers the protecting element 70. When the protecting member 50 is disposed on the second A surface 21, the reflecting member 80 is disposed also covering the protecting member 50.

Examples of a material of the reflecting member 80 include a material in which a light reflective material is contained in a resin material to serve as the base material. The reflecting member 80 is disposed by, for example, application. The reflecting member 80 preferably has a thickness increased toward the lateral wall portion 3.

(7) Disposing of Covering Member

Subsequently, a covering member is disposed on the inner side of the lateral wall portion 3 to cover the lateral surfaces 60a and the upper surface 60b of the light emitting element 60.

The light emitting device 1 according to the first embodiment is obtained as described above.

While certain embodiments of the present disclosure have been described above, the contents of the present disclosure may vary in details of the configurations, and changes in the combination and order of the constituent elements in the embodiments, and the like can be made without departing from the scope and spirit of the present disclosure as claimed.

What is claimed is:

1. A light emitting device comprising:
   a base comprising:
      a first lead including:
         a first A surface,
         a first B surface opposite to the first A surface, and
         a first C surface located between the first A surface and the first B surface and defining at least one first protrusion,
      a second lead separated from the first lead, and
      a resin body covering the first C surface and holding the first lead and the second lead;
   a light emitting element disposed on the first A surface; and
   a protecting member disposed continuously on at least a portion of the first A surface and in at least a portion of a gap between the first protrusion and the resin body, wherein,
   in a cross-sectional view, the first protrusion extends from a first end portion of the first A surface at a second lead side toward the second lead,
   the protecting member covers at least a portion of each of a plurality of lateral surfaces of the light emitting element, and
   a maximum thickness of a portion of the protecting member covering the lateral surfaces of the light emitting element is greater than an average thickness of a portion of the protecting member covering the first A surface at a position apart from the light emitting element.

2. The light emitting device according to claim 1, wherein:
   in the cross-sectional view, the first protrusion extends from a second end portion of the first B surface at the second lead side toward the second lead.

3. The light emitting device according to claim 2, wherein:
   in the cross-sectional view, a distance between the first end portion and the second lead is less than a distance between the second end portion and the second lead.

4. The light emitting device according to claim 1, wherein:
   a surface of the first protrusion extending from the first end portion to a tip portion of the first protrusion includes a curved surface that is concavely curved toward the first B surface.

5. The light emitting device according to claim 1, wherein:
   the maximum thickness of the portion of the protecting member covering the lateral surface of the light emitting element is in a range of five times to 50 times the average thickness of the portion of the protecting member covering the first A surface at the position apart from the light emitting element.

6. The light emitting device according to claim 1, wherein:
   the resin body includes a lateral wall portion surrounding the light emitting element in a top view,
   the protecting member covers at least a portion of each of a plurality of lateral surfaces of the light emitting element and at least a portion of an inner lateral surface of the lateral wall portion, and
   a portion of the protecting member covering the first A surface is continuously connected with a portion of the protecting member covering the at least a portion of each of the plurality of lateral surfaces of the light emitting element and a portion of the protecting member covering the at least a portion of the inner side surface of the lateral wall portion.

7. The light emitting device according to claim 6, wherein:
   a maximum height of the portion of the protecting member covering each of the plurality of lateral surfaces of the light emitting element from the first A surface is equal to a maximum height of the portion of the protecting member covering the inner lateral surface of the lateral wall portion from the first A surface.

8. The light emitting device according to claim 1, wherein:
   the resin body includes a lateral wall portion surrounding the light emitting element in a top view, and
   in the top view, the first protrusion is located along an entirety of a portion of the first C surface that is surrounded by the lateral wall portion.

9. The light emitting device according to claim 1, wherein:
   the second lead includes:
      a second A surface,
      a second B surface opposite to the second A surface, and
      a second C surface located between the second A surface and the second B surface and defining at least one second protrusion,
   the protecting member is disposed in at least a portion of a gap between the second protrusion and the resin body, and
   in the cross-sectional view, the second protrusion extends from an end portion of the second A surface at a first lead side toward the first lead.

10. The light emitting device according to claim 9, wherein:
in a top plan view, the light emitting element overlaps with the first protrusion and the second protrusion.

11. The light emitting device according to claim 1, wherein:
the protecting member contains resin and particles, and
in a cross-sectional view, an area of the particles is in a range of 0.5 times to 100 times an area of the resin.

12. The light emitting device according to claim 1, wherein:
the first B surface is exposed from the resin body.

13. The light emitting device according to claim 1, wherein:
the resin body includes a lateral wall portion surrounding the light emitting element in a top view,
the protecting member covers at least a portion of each of a plurality of lateral surfaces of the light emitting element and at least a portion of an inner lateral surface of the lateral wall portion,
a portion of the protecting member covering the first A surface is continuously connected with a portion of the protecting member covering the at least a portion of each of the plurality of lateral surfaces of the light emitting element and a portion of the protecting member covering the at least a portion of the inner side surface of the lateral wall portion,
the protecting member contains resin and particles, and
in a cross-sectional view, an area of the particles is in a range of 0.5 times to 100 times an area of the resin.

14. The light emitting device according to claim 1, wherein:
the resin body includes a lateral wall portion surrounding the light emitting element in a top view,
the protecting member covers at least a portion of each of a plurality of lateral surfaces of the light emitting element and at least a portion of an inner lateral surface of the lateral wall portion,
a portion of the protecting member covering the first A surface is continuously connected with a portion of the protecting member covering the at least a portion of each of the plurality of lateral surfaces of the light emitting element and a portion of the protecting member covering the at least a portion of the inner side surface of the lateral wall portion,
a maximum height of the portion of the protecting member covering each of the plurality of lateral surfaces of the light emitting element from the first A surface is equal to a maximum height of the portion of the protecting member covering the inner lateral surface of the lateral wall portion from the first A surface,
the protecting member contains resin and particles, and
in a cross-sectional view, an area of the particles is in a range of 0.5 times to 100 times an area of the resin.

15. A light emitting device comprising:
a base comprising:
a first lead including:
a first A surface,
a first B surface opposite to the first A surface, and
a first C surface located between the first A surface and the first B surface and defining at least one first protrusion,
a second lead separated from the first lead, and
a resin body covering the first C surface and holding the first lead and the second lead;
a light emitting element disposed on the first A surface; and
a protecting member disposed continuously on at least a portion of the first A surface and in at least a portion of a gap between the first protrusion and the resin body, wherein:
in a cross-sectional view, the first protrusion extends from a first end portion of the first A surface at a second lead side toward the second lead,
the resin body includes a lateral wall portion surrounding the light emitting element in a top view,
the protecting member covers at least a portion of each of a plurality of lateral surfaces of the light emitting element and at least a portion of an inner lateral surface of the lateral wall portion, and
a portion of the protecting member covering the first A surface is continuously connected with a portion of the protecting member covering the at least a portion of each of the plurality of lateral surfaces of the light emitting element and a portion of the protecting member covering the at least a portion of the inner side surface of the lateral wall portion.

16. The light emitting device according to claim 15, wherein:
in the cross-sectional view, the first protrusion extends from a second end portion of the first B surface at the second lead side toward the second lead.

17. The light emitting device according to claim 15, wherein:
a maximum height of the portion of the protecting member covering each of the plurality of lateral surfaces of the light emitting element from the first A surface is equal to a maximum height of the portion of the protecting member covering the inner lateral surface of the lateral wall portion from the first A surface.

18. The light emitting device according to claim 15, wherein:
the protecting member contains resin and particles, and
in a cross-sectional view, an area of the particles is in a range of 0.5 times to 100 times an area of the resin.

19. The light emitting device according to claim 15, wherein:
a maximum height of the portion of the protecting member covering each of the plurality of lateral surfaces of the light emitting element from the first A surface is equal to a maximum height of the portion of the protecting member covering the inner lateral surface of the lateral wall portion from the first A surface,
the protecting member contains resin and particles, and
in a cross-sectional view, an area of the particles is in a range of 0.5 times to 100 times an area of the resin.

20. A light emitting device comprising:
a base comprising:
a first lead including:
a first A surface,
a first B surface opposite to the first A surface, and
a first C surface located between the first A surface and the first B surface and defining at least one first protrusion,
a second lead separated from the first lead, and
a resin body covering the first C surface and holding the first lead and the second lead;
a light emitting element disposed on the first A surface; and
a protecting member disposed continuously on at least a portion of the first A surface and in at least a portion of a gap between the first protrusion and the resin body, wherein:

in a cross-sectional view, the first protrusion extends from a first end portion of the first A surface at a second lead side toward the second lead,
the protecting member contains resin and particles, and
in a cross-sectional view, an area of the particles is in a range of 0.5 times to 100 times an area of the resin.

* * * * *